US007352869B2

(12) United States Patent
Inoue et al.

(10) Patent No.: US 7,352,869 B2
(45) Date of Patent: Apr. 1, 2008

(54) APPARATUS FOR AND METHOD OF ACTIVELY CONTROLLING VIBRATORY NOISE, AND VEHICLE WITH ACTIVE VIBRATORY NOISE CONTROL APPARATUS

(75) Inventors: Toshio Inoue, Tochigi-ken (JP); Akira Takahashi, Tochigi-ken (JP); Yoshio Nakamura, Neyagawa (JP); Masahide Onishi, Osaka (JP)

(73) Assignees: Honda Motor Co., Ltd., Tokyo (JP); Matsushita Electric Industrial Co., Ltd., Osaka (JP)

( * ) Notice: Subject to any disclaimer, the term of this patent is extended or adjusted under 35 U.S.C. 154(b) by 703 days.

(21) Appl. No.: 10/859,581

(22) Filed: Jun. 3, 2004

(65) Prior Publication Data

US 2004/0247137 A1 Dec. 9, 2004

(30) Foreign Application Priority Data

Jun. 5, 2003 (JP) ............................ 2003-160699

(51) Int. Cl.
*G10K 11/16* (2006.01)
*H03B 29/00* (2006.01)

(52) U.S. Cl. .................... 381/71.11; 381/86; 381/94.1; 381/71.8

(58) Field of Classification Search ............ 381/71.11, 381/74.4, 74.1, 74.11, 74.12, 94.1, 86; 700/28
See application file for complete search history.

(56) References Cited

U.S. PATENT DOCUMENTS 4,878,188 A 10/1989 Ziegler, Jr.
5,170,433 A * 12/1992 Elliott et al. ................ 704/226
5,377,276 A * 12/1994 Terai et al. .............. 381/71.11
5,544,080 A * 8/1996 Kobayashi et al. ......... 700/280
6,094,601 A * 7/2000 Popovich ..................... 700/28
6,216,047 B1 * 4/2001 Goto ........................... 700/28
7,062,049 B1 * 6/2006 Inoue et al. ............... 381/71.4
2004/0240678 A1 12/2004 Nakamura et al.
2004/0247137 A1 12/2004 Inoue et al.

FOREIGN PATENT DOCUMENTS

EP 1 515 304 A2 3/2005
JP 05-289679 5/1993
JP 05-051787 A 2/1994
JP 06-118970 4/1994

(Continued)

*Primary Examiner*—Vivian Chin
*Assistant Examiner*—Con P. Tran
(74) *Attorney, Agent, or Firm*—Arent Fox, LLP.

(57) ABSTRACT

The filter coefficients of an adaptive notch filter are sequentially updated to minimize an error signal based on the error signal and a first reference signal which is produced by subtracting a signal which represents the product of a sine corrective value C1 and a reference sine signal, from a signal which represents the product of a cosine corrective value C0 and a reference cosine signal. The filter coefficients of an adaptive notch filter are sequentially updated to minimize the error signal based on the error signal and a second reference signal which is produced by adding a signal which represents the product of the reference sine signal and the cosine corrective value C0 and a signal which represents the product of the reference cosine signal and the sine corrective value C1 to each other.

7 Claims, 14 Drawing Sheets

FOREIGN PATENT DOCUMENTS

| | | | |
|---|---|---|---|
| JP | 06-222779 | | 8/1994 |
| JP | 06-236188 | A | 8/1994 |
| JP | 06-282273 | | 10/1994 |
| JP | 07-287586 | | 10/1995 |
| JP | 08-006573 | | 1/1996 |
| JP | 08-297493 | A | 11/1996 |
| JP | 08-339191 | A | 12/1996 |
| JP | 11-149291 | | 6/1999 |
| JP | 2000-099037 | | 4/2000 |
| JP | 2000-099037 | A1 | 4/2000 |
| JP | 2001-140974 | A | 5/2001 |
| WO | WO 88/02912 | | 4/1988 |

* cited by examiner

FIG. 7A
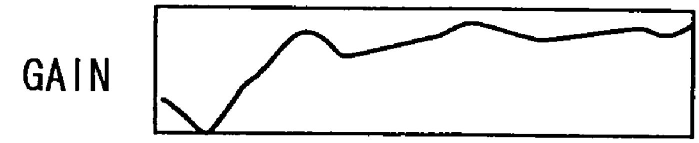
FIG. 7B
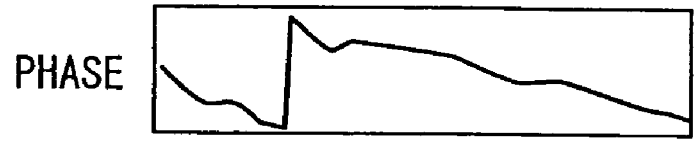
FIG. 7C
| f | GAIN (dB) | PHASE LAG | GAIN(α) |
|---|---|---|---|
| 30 | −30 | 328.2 | 4.016 |
| · | · | · | · |
| 40 | −28 | 348.8 | 5.056 |
| 41 | −20 | 359.7 | 12.700 |
| 42 | −10 | 6.6 | 40.161 |
| 43 | −6 | 15.2 | 63.651 |
| · | · | · | · |
| · | · | · | · |
| 200 | −12 | 146.2 | 31.901 |
| · | · | · | · |
| 230 | −8 | 256.1 | 50.560 |
FIG. 7D
| f | CO | C1 |
|---|---|---|
| 30 | 3 | −2 |
| · | · | · |
| 40 | 5 | −1 |
| 41 | 13 | 0 |
| 42 | 40 | 5 |
| 43 | 62 | 17 |
| · | · | · |
| · | · | · |
| 200 | −27 | 18 |
| · | · | · |
| 230 | −12 | −49 |

FIG. 10A
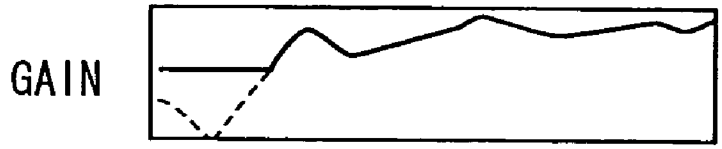
FIG. 10B
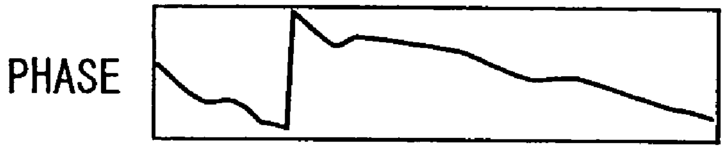
FIG. 10C
| f | GAIN (dB) | PHASE LAG | GAIN(α) |
|---|---|---|---|
| 30 | −10 | 328.2 | 40.161 |
| · | · | · | · |
| 40 | −10 | 348.8 | 40.161 |
| 41 | −10 | 359.7 | 40.161 |
| 42 | −10 | 6.6 | 40.161 |
| 43 | −6 | 15.2 | 63.651 |
| · | · | · | · |
| · | · | · | · |
| 200 | −12 | 146.2 | 31.901 |
| · | · | · | · |
| 230 | −8 | 256.1 | 50.560 |
FIG. 10D
| f | CO | C1 |
|---|---|---|
| 30 | 34 | −21 |
| · | · | · |
| 40 | 40 | −8 |
| 41 | 40 | 0 |
| 42 | 40 | 5 |
| 43 | 62 | 17 |
| · | · | · |
| · | · | · |
| 200 | −27 | 18 |
| · | · | · |
| 230 | −12 | −49 |

FIG. 11A
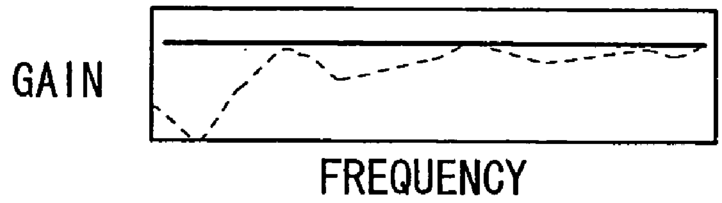
FIG. 11B
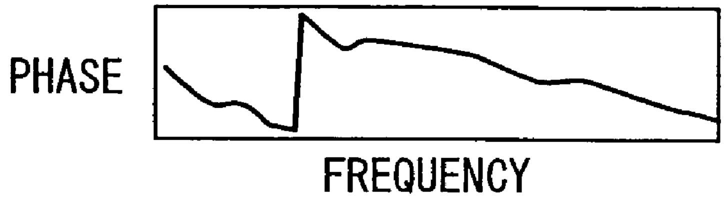
FIG. 11C
| f | GAIN (dB) | PHASE LAG | GAIN(α) |
|---|---|---|---|
| 30 | 0 | 328.2 | 127.00 |
| · | · | · | · |
| 40 | 0 | 348.8 | 127.00 |
| 41 | 0 | 359.7 | 127.00 |
| 42 | 0 | 6.6 | 127.00 |
| 43 | 0 | 15.2 | 127.00 |
| · | · | · | · |
| · | · | · | · |
| 200 | 0 | 146.2 | 127.00 |
| · | · | · | · |
| 230 | 0 | 256.1 | 127.00 |
FIG. 11D
| f | CO | C1 |
|---|---|---|
| 30 | 109 | -67 |
| · | · | · |
| 40 | 126 | -25 |
| 41 | 127 | -1 |
| 42 | 127 | 15 |
| 43 | 124 | 34 |
| · | · | · |
| · | · | · |
| 200 | -106 | 71 |
| · | · | · |
| 230 | -31 | -124 |

APPARATUS FOR AND METHOD OF ACTIVELY CONTROLLING VIBRATORY NOISE, AND VEHICLE WITH ACTIVE VIBRATORY NOISE CONTROL APPARATUS

BACKGROUND OF THE INVENTION

1. Field of the Invention

The present invention relates to an apparatus for and a method of actively controlling vibratory noise with adaptive notch filters, which may be used on vehicles, and a vehicle incorporating an active vibratory noise control apparatus.

2. Description of the Related Art

Heretofore, it has been the general practice in the field of active vibratory noise control in vehicle passenger compartments to model signal transfer characteristics to be controlled with a FIR filter, supply the FIR filter with input pulses based on the engine rotational speed and suspension vibration outputs that are highly correlated to vibratory noise to be controlled, use an output signal from the FIR filter as a reference signal, adaptively generate a signal to produce canceling vibratory noise for reducing an error signal from the reference signal and the error signal, and apply the generated signal to an actuator to produce secondary vibratory noise to reduce the vibratory noise.

According to an example of the above active vibratory noise control process, a reference signal is generated by a reference signal generator in response to an engine rotational speed signal, the generated reference signal is applied to an adaptive FIR filter, which produces an output signal to drive a speaker. The difference between vibratory noise caused in a vehicle passenger compartment by the output energy radiated from the speaker and vibratory noise produced in the vehicle passenger compartment by engine rotation, etc. is detected by a microphone installed in the vehicle passenger compartment, and the adaptive FIR filter is controlled to reduce an output signal from the microphone (see, for example, Japanese laid-open patent publication No. 1-501344).

Another example is known as an active vibratory noise control apparatus employing adaptive notch filters, as shown in FIG. 14 of the accompanying drawings. This active vibratory noise control apparatus is based on the fact that vibratory noise in a vehicle passenger compartment is generated in synchronism with the rotation of the output shaft of the engine. The vibratory noise that is produced in the vehicle passenger compartment at a frequency based on the rotation of the output shaft of the engine is silenced using the adaptive notch filters.

In the known active vibratory noise control apparatus employing adaptive notch filters, as shown in FIG. 14, engine pulses which are synchronous with the rotation of the output shaft of the engine are shaped in waveform by a waveform shaper 71, whose output signal is applied to a cosine wave generator 72 and a sine wave generator 73 which generate a cosine wave signal and a sine wave signal, respectively. The cosine wave signal is passed through an adaptive notch filter 74, and the sine wave signal is passed through an adaptive notch filter 75. Output signals from the adaptive notch filters 74, 75 are added by an adder 76 into a sum signal, which is applied to energize a secondary vibratory noise generator 77.

The cosine wave signal is applied to a transfer element 78 having passenger-compartment signal transfer characteristics (γ0) for the frequency in synchronism with the rotation of the engine output shaft, and the sine wave signal is applied to a transfer element 79 having passenger-compartment signal transfer characteristics (γ1) for the frequency in synchronism with the rotation of the engine output shaft. Output signals from the transfer elements 78, 79 are added into a first reference signal by an adder 80. The sine wave signal is applied to a transfer element 81 having the passenger-compartment signal transfer characteristics (γ0), and the cosine wave signal is applied to a transfer element 82 having passenger-compartment signal transfer characteristics (−γ1). Output signals from the transfer elements 81, 82 are added into a second reference signal by an adder 83. The filter coefficients of the adaptive notch filter 74 are updated according to an adaptive algorithm based on the first reference signal, and the filter coefficients of the adaptive notch filter 75 are updated according to an adaptive algorithm based on the second reference signal, so that an error signal detected by an error detecting means 86 will be minimized. For details, reference should be made to Japanese laid-open patent publication No. 2000-99037, for example.

The above example of the active vibratory noise control process which employs an FIR filter for producing a reference signal (for example, Japanese laid-open patent publication No. 1-501344) is problematic in that because of convolutional calculations to be done by the FIR filter, if the active vibratory noise control process is to cancel passenger-compartment vibratory noise at rapid accelerations of the vehicle, the sampling frequency needs to be increased, and the number of taps of the FIR filter also needs to be increased, with the results that the processing load on the FIR filter is large, and an active vibratory noise control apparatus for performing the active vibratory noise control process requires a processor having a large processing capability, such as a digital signal processor and hence is highly expensive.

The active vibratory noise control apparatus employing adaptive notch filters (for example, Japanese laid-open patent publication No. 2000-99037) is disadvantageous in that though the amount of calculations required to produce reference signals may be small, the signal transfer characteristics from the secondary vibratory noise generator to the error signal detecting means is not sufficiently optimally modeled, and optimum reference signals for updating the filter coefficients of the adaptive notch filters are not obtained, with the results that the active vibratory noise control apparatus may find it difficult to cancel passenger-compartment vibratory noise at rapid accelerations of the vehicle and fail to provide a sufficient vibratory noise control capability.

SUMMARY OF THE INVENTION

It is an object of the present invention to provide an apparatus for and a method of actively controlling vibratory noise with a sufficient vibratory noise control capability with a reduced amount of calculations required to produce reference signals, and a vehicle incorporating such an active vibratory noise control apparatus therein.

In an active vibratory noise control apparatus according to the present invention, a reference signal generating means outputs, as reference signals, a reference sine wave signal and a reference cosine wave signal having a frequency based on the frequency of vibration from a vibratory noise source. In order to cancel generated vibratory noise which is generated based on the vibration from the vibratory noise source, a first adaptive notch filter outputs a first control signal based on the reference cosine wave signal and a second adaptive notch filter outputs a second control signal based on the reference sine wave signal. A sum signal representing the sum of the first control signal and the second control signal is input to a vibratory noise canceling means, which outputs canceling vibratory noise to cancel the generated vibratory noise.

For canceling the generated vibratory noise, an error signal detecting means detects an error signal based on the difference between the generated vibratory noise and the canceling vibratory noise output from the vibratory noise canceling means. A correcting means outputs, as a first reference signal, a signal produced by subtracting the product of a sine corrective value based on the sine value of the phase characteristics of the signal transfer characteristics from the vibratory noise canceling means to the error signal detecting means with respect to the frequencies of the reference signals and the reference sine wave signal, from the product of a cosine corrective value based on the cosine value of the phase characteristics of the signal transfer characteristics and the reference cosine wave signal, and outputs, as a second reference signal, a signal produced by adding the product of the sine corrective value and the reference cosine wave signal and the product of the cosine corrective value and the reference sine wave signal to each other. A filter coefficient updating means sequentially updates filter coefficients of the first and second adaptive notch filters to minimize the error signal based on the error signal and the first and second reference signals. The generated vibratory noise is canceled by the canceling vibratory noise output from the vibratory noise canceling means.

The active vibratory noise control apparatus according to the present invention uses, as the first reference signal, the signal produced by subtracting the product of the sine corrective value based on the sine value of the phase characteristics of the signal transfer characteristics from the vibratory noise canceling means to the error signal detecting means and the reference sine wave signal, from the product of the cosine corrective value based on the cosine value of the phase characteristics of the signal transfer characteristics and the reference cosine wave signal, and uses, as the second reference signal, the signal produced by adding the product of the sine corrective value and the reference cosine wave signal and the product of the cosine corrective value and the reference sine wave signal to each other, without employing FIR filters to produce reference signals. therefore, the reference signals for updating the filter coefficients of the first and second adaptive notch filters are optimally corrected. Even when the frequencies of the reference signals change in a transient fashion as when a vehicle incorporating the apparatus is accelerated quickly, the generated vibratory noise can be canceled accurately based on output signals from the first and second adaptive notch filters.

Since the first and second reference signals are obtained as optimally corrected signals from the reference signals, the contours of constant square error curves become concentric circles, canceling the generated vibratory noise with a quick converging capability.

The active vibratory noise control apparatus according to the present invention requires four multiplications and two additions for generating the first and second reference signals to cancel the vibratory noise each time the filter coefficients of the first and second adaptive notch filters are updated. Therefore, the amount of calculations for obtaining the first and second reference signals is much smaller than if FIR filters were used, allowing the active vibratory noise control apparatus to be manufactured inexpensively.

In the active vibratory noise control apparatus, the cosine corrective value and the sine corrective value are stored in advance in a storage device in association with the frequencies of the reference signals, and are read therefrom in association with the frequencies of the reference signals. The cosine corrective value and sine corrective value that are read, and the reference cosine wave signal and the reference sine wave signal are multiplied, and the products are added to produce the first and second reference signals. Thus, the first and second reference signals can be calculated simply.

In the active vibratory noise control apparatus, a measurement gain of a predetermined frequency in the signal transfer characteristics is corrected at a predetermined value, and the cosine corrective value and the sine corrective value which are stored in the storage device with respect to reference signals having the same frequency comprise values determined based on the corrected gain and measured phase characteristics.

The cosine corrective value and the sine corrective value include a gain variation range and variation ranges of cosine and sine values based on the phase characteristics (ϕ). In the calculating process, figure canceling occurs because of the number of effective figures, resulting in a reduction in the accuracy with which to calculate the first and second reference signals or the filter coefficients of the first and second adaptive notch filers, and hence in a reduction in the sound silencing capability. The converging speed of the filter coefficients is lowered, resulting in poor responsiveness.

By using a gain produced by correcting a measurement gain so as not to cause figure canceling in the calculating process and basically determining the cosine corrective value and the sine corrective value based on the measured phase characteristics, the first and second reference signals or the filter coefficients of the first and second adaptive notch filers are calculated with increased accuracy, so that the noise silencing accuracy is increased. Step size parameters for updating the filter coefficients of the first and second adaptive notch filers are adequately adjusted, so that the converging speed of the filter coefficients is increased, resulting in better responsiveness.

According to the present invention, furthermore, a method of actively controlling vibratory noise, comprises the steps of:

outputting, as reference signals, a reference sine wave signal and a reference cosine wave signal having a frequency based on the frequency of vibration from a vibratory noise source;

outputting a first control signal with a first adaptive notch filter based on the reference cosine wave signal and outputting a second control signal with a second adaptive notch filter based on the reference sine wave signal in order to cancel generated vibratory noise which is generated based on the vibration from the vibratory noise source;

inputting a sum signal representing the sum of the first control signal and the second control signal to a vibratory noise canceling means, and outputting canceling vibratory noise to cancel the generated vibratory noise from the vibratory noise canceling means;

outputting an error signal from an error signal detecting means based on the difference between the generated vibratory noise and the canceling vibratory noise output from the vibratory noise canceling means;

correcting the reference cosine wave signal and the reference sine wave signal based on corrective values corresponding to signal transfer characteristics from the vibratory noise canceling means to the error signal detecting means with respect to the frequencies of the reference signals, and outputting the corrected reference cosine wave signal and the corrected reference sine wave signal respectively as first and second reference signals; and sequentially updating filter coefficients of the first adaptive notch filter and the second adaptive notch filter to minimize the error signal based on the error signal and the first and second reference signals;

wherein the correcting step outputs, as the first reference signal, a signal produced by subtracting the product of a sine corrective value based on the sine value of the phase characteristics of the signal transfer characteristics and the reference sine wave signal from the product of a cosine corrective value based on the cosine value of the phase characteristics of the signal transfer characteristics and the reference cosine wave signal, and outputs, as the second reference signal, a signal produced by adding the product of the sine corrective value and the reference cosine wave signal and the product of the cosine corrective value and the reference sine wave signal to each other; and wherein the updating step successively updates the filter coefficients of the first adaptive notch filter based on the first reference signal and the error signal and successively updates the filter coefficients of the second adaptive notch filter based on the second reference signal and the error signal.

In the above method, the cosine corrective value and the sine corrective value are stored in advance in a storage device in association with the frequencies of the reference signals, and are read therefrom in association with the frequencies of the reference signals.

In the above method, a measurement gain of a predetermined frequency in the signal transfer characteristics is corrected at a predetermined value, and the cosine corrective value and the sine corrective value which are stored in the storage device with respect to reference signals having the same frequency comprise values determined based on the corrected gain and measured phase characteristics.

By incorporating the active vibratory noise control apparatus according to the present invention in a vehicle, it is possible to effectively cancel muffled sounds in the passenger compartment of the vehicle.

The above and other objects, features, and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIGS. 7A through 7D are diagrams illustrative of cosine corrective value calculations and sine corrective value calculations by the active vibratory noise control apparatus according to the embodiment of the present invention which is incorporated in the vehicle;

FIGS. 10A through 10D are diagrams illustrative of cosine corrective value calculations and sine corrective value calculations by the active vibratory noise control apparatus according to the embodiment of the present invention which is incorporated in the vehicle;

FIGS. 11A through 11D are diagrams illustrative of cosine corrective value calculations and sine corrective value calculations by the active vibratory noise control apparatus according to the embodiment of the present invention which is incorporated in the vehicle;

DESCRIPTION OF THE PREFERRED EMBODIMENTS

Active vibratory noise control apparatus according to preferred embodiments of the present invention will be described below.

Figure 1:
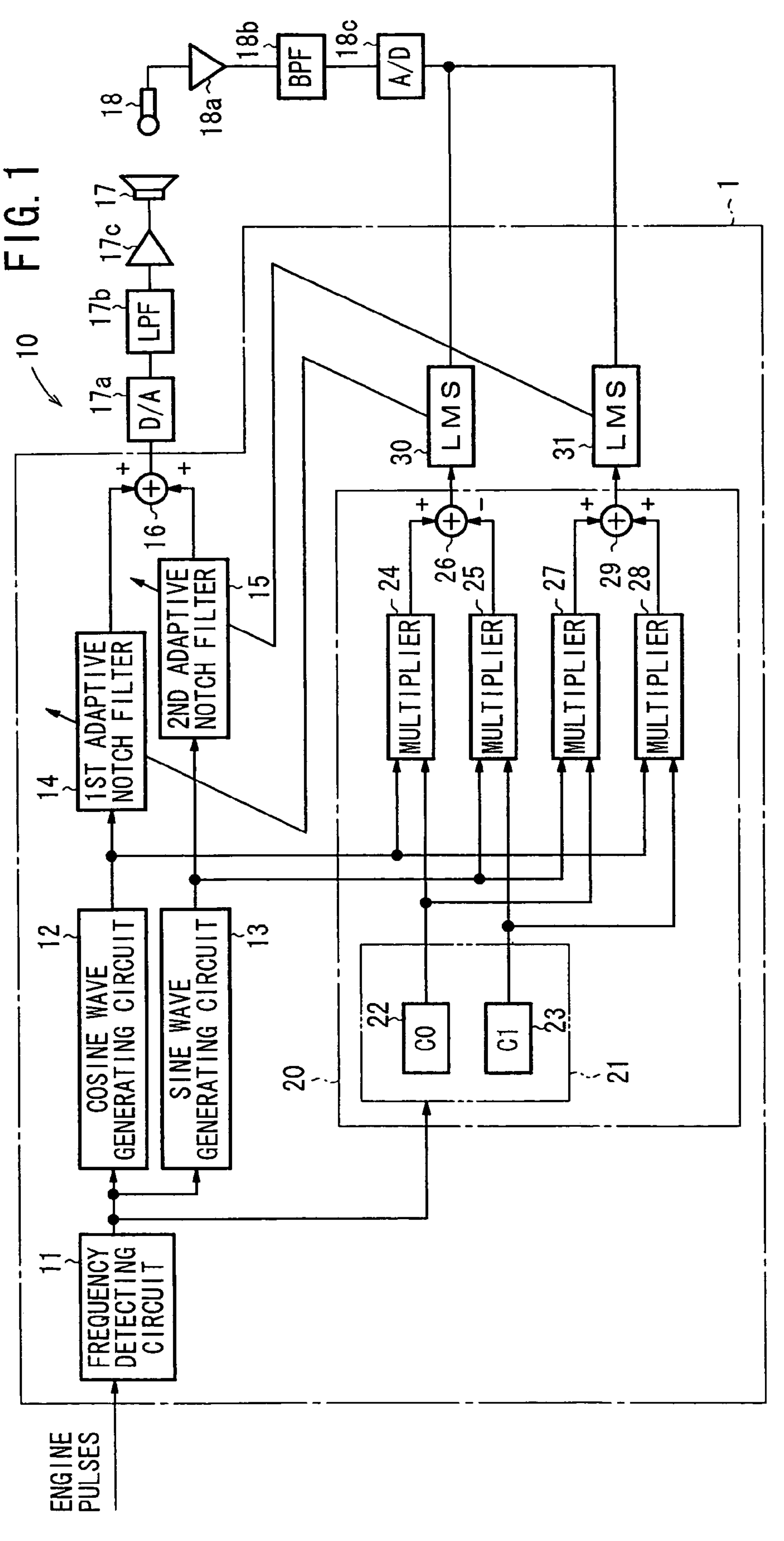
FIG. 1 is a block diagram of an active vibratory noise control apparatus according to an embodiment of the present invention.

FIG. 1 shows in block form an active vibratory noise control apparatus according to an embodiment of the present invention.

The active vibratory noise control apparatus, generally designated by 10 in FIG. 1, is arranged to cancel muffled sounds of the engine on a vehicle, for example, which serve as main vibratory noise in the passenger compartment of the vehicle.

As shown in FIG. 1, the active vibratory noise control apparatus 10 has primary components which are functionally implemented by a microcomputer 1. The rotational speed of the output shaft of the engine is detected as engine pulses such as top-dead-center pulses by a Hall device. The detected engine pulses are supplied to a frequency detecting circuit 11 of the active vibratory noise control apparatus The frequency detecting circuit 11 detects the frequency of the engine pulses from the engine pulses, and generates a signal based on the detected frequency.

The frequency detecting circuit 11 monitors engine pulses at a sampling frequency that is much higher than the frequency of the engine pulses, detects timings at which the polarity of the engine pulses changes, measure time intervals between the detected timings to detect the frequency of the engine pulses as a rotational speed of the engine output shaft, and outputs a control frequency in synchronism with the rotational speed of the engine output shaft based on the detected frequency.

Since muffled sounds of the engine are vibratory radiation sounds which are produced when vibratory forces generated by the rotation of the engine output shaft are transmitted to the vehicle body. The muffled sounds are periodic in synchronism with the rotational speed of the engine output shaft. If the engine comprises a 4-cycle 4-cylinder engine, for example, then the engine produces vibrations due to torque variations thereof upon gas combustion each time the engine output shaft makes one-half of a revolution, causing vibratory noise in the passenger compartment of the vehicle.

Since vibratory noise referred to as a rotational secondary component having a frequency which is twice the rotational speed of the engine output shaft is generated if the engine comprises a 4-cycle 4-cylinder engine, the frequency detecting circuit 11 generates and output a frequency which is twice the detected frequency as the control frequency.

The output signal from the frequency detecting circuit 11 is supplied to a cosine wave generating circuit 12, which generates and outputs a reference cosine wave signal having the frequency which is output from the frequency detecting circuit 11. Similarly, the output signal from the frequency detecting circuit 11 is supplied to a sine wave generating circuit 13, which generates and outputs a reference sine wave signal having the frequency which is output from the frequency detecting circuit 11. The reference cosine wave signal and the reference sine wave signal, thus generated and output, serve as reference signals having harmonic frequencies of the frequency of the rotation of the engine output shaft.

The reference cosine wave signal is supplied to a first adaptive notch filter 14, whose filter coefficients are adaptively processed and updated by an LMS algorithm, to be described later. The reference sine wave signal is supplied to a second adaptive notch filter 15, whose filter coefficients are adaptively processed and updated by an LMS algorithm, to be described later. An output signal from the first adaptive notch filter 14 and an output signal from the second adaptive notch filter 15 are supplied to an adder 16, which supplies an output sum signal to an D/A converter 17_a_. The D/A converter 17_a_ converts the output sum signal into an analog signal that is applied through a low-pass filter (LPF) 17_b_ and an amplifier (AMP) 17_c_ to a speaker 17, which outputs radiated sounds.

Therefore, the output sum signal (vibratory noise canceling signal) from the adder 16 is supplied to the speaker 17, which is installed in the passenger compartment to generate canceling vibratory noise. The speaker 17 is thus driven by the output sum signal from adder 16. The passenger compartment houses therein a microphone 18 for detecting remaining vibratory noise in the passenger compartment and outputting the detected remaining vibratory noise as an error signal.

The output signal from the microphone 18 is supplied through an amplifier (AMP) 18_a_ and a bandpass filter (BPF) 18_b_ to an A/D converter 18_c_, which converts the supplied signal into digital data that is input to LMS algorithm processors 30, 31.

The frequency detecting circuit 11 also generates a timing signal (sampling pulses) having the sampling period of the microcomputer 1. The microcomputer 1 performs a processing sequence based on the timing signal.

A reference signal generating circuit 20 has a storage device 21 comprising a memory 22 for storing a cosine corrective value C0, in association with the control frequency, based on the cosine value of a phase lag in the signal transfer characteristics between the speaker 17 and the microphone 18, and a memory 23 for storing a sine corrective value C1, in association with the control frequency, based on the sine value of the phase lag in the signal transfer characteristics between the speaker 17 and the microphone 18. The storage device 21 is accessed by a timing signal output from the frequency detecting circuit 11 to read the cosine corrective value C0 and the sine corrective value C1, which correspond to the control frequency, from the respective memories 22, 23.

The reference signal generating circuit 20 also has a multiplier 24 for multiplying the cosine corrective value C0 read from the storage device 21 and the reference cosine wave signal output from the cosine wave generating circuit 12 by each other, a multiplier 25 for multiplying the sine corrective value C1 read from the storage device 21 and the reference sine wave signal output from the sine wave generating circuit 13 by each other, an adder 26 for subtracting an output signal of the multiplier 25 from an output signal of the multiplier 24 to each other and outputting the differential signal as a first reference signal, a multiplier 27 for multiplying the cosine corrective value C0 read from the storage device 21 and the reference sine wave signal output from the sine wave generating circuit 13 by each other, a multiplier 28 for multiplying the sine corrective value C1 read from the storage device 21 and the reference cosine wave signal output from the cosine wave generating circuit 12 by each other, and an adder 29 for adding an output signal of the multiplier 27 from an output signal of the multiplier 28 to each other and outputting the sum signal as a second reference signal.

The first reference signal output from the adder 26 and the output signal from the microphone 18 are supplied to an LMS algorithm processor 30 and processed according to an LMS algorithm thereby. The filter coefficients of the first adaptive notch filter 14 are updated based on an output signal from the LMS algorithm processor 30 to minimize the output signal from the microphone 18, i.e., the error signal. The second reference signal output from the adder 29 and the output signal from the microphone 18 are supplied to an LMS algorithm processor 31 and processed according to an LMS algorithm thereby. The filter coefficients of the second adaptive notch filter 15 are updated based on an output signal from the LMS algorithm processor 31 to minimize the output signal from the microphone 18, i.e., the error signal.

Generation of the cosine corrective value C0 and the sine corrective value C1 and operation of the active vibratory noise control apparatus 10 will be described below.

Figure 2:
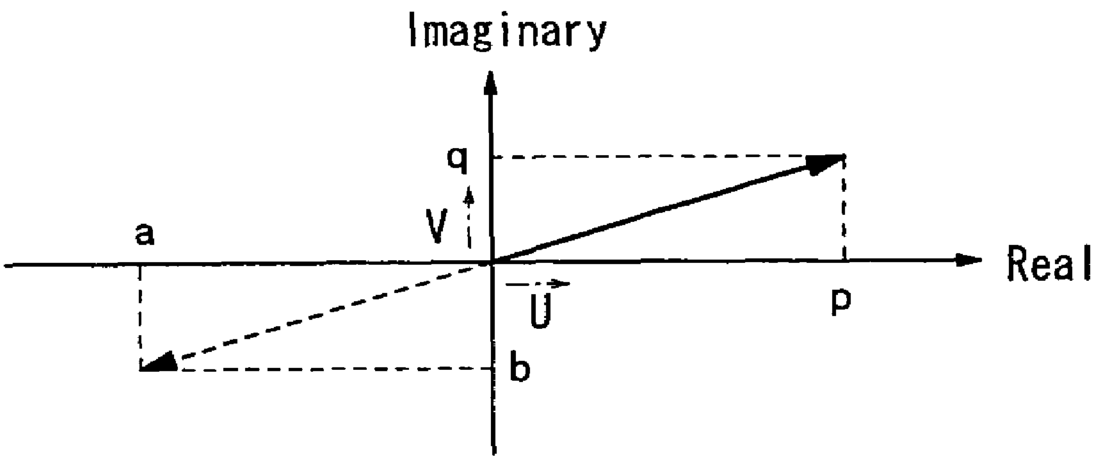
FIG. 2 is a diagram illustrative of a muffled-sound canceling process of the active vibratory noise control apparatus according to the embodiment of the present invention.

Muffled sounds of the engine represent vibratory noise having a narrow frequency band in synchronism with the rotation of the engine output shaft because the muffled sounds are produced due to gas combustion in the engine. All muffled sounds (waves) can be represented by the sum of mutually orthogonal cosine and sine waves having the frequency f of the muffled sounds. The muffled sounds can be expressed by a solid-line curve on a complex plane as shown in FIG. 2, i.e., expressed as ($p \cos 2\pi ft + iq \sin 2\pi ft$). Therefore, the muffled sounds can be expressed as a vector having two coefficients p, q by generating a reference cosine wave signal (Cs ($=\cos 2\pi ft$), 0) and a reference sine wave signal (0, Sn ($=\sin 2\pi ft$)) which are mutually orthogonal, as indicated by the dot-and-dash lines U, V.

The muffled sounds are thus expressed by the two coefficients p, q by making two mutually orthogonal reference signals. For canceling the muffled sounds which are vibratory noise, canceling vibratory noise having coefficients expressed by a (=−1×p), b=(−1×q), as indicated by the broken lines in FIG. 2 may be generated.

Figure 3:
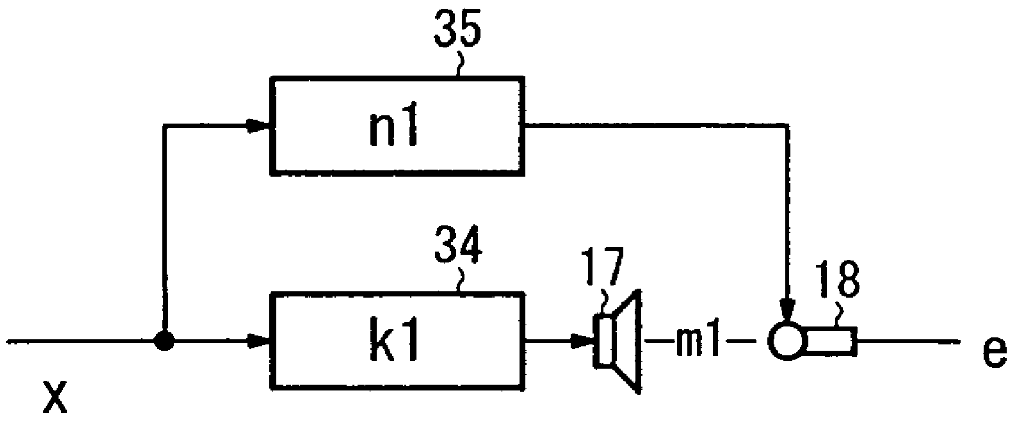
FIG. 3 is a block diagram of an arrangement for performing the muffled-sound canceling process of the active vibratory noise control apparatus according to the embodiment of the present invention.

The arrangement shown in FIG. 1 may be schematically represented as shown in FIG. 3. In FIG. 3, an input reference signal x having the control frequency based on the signal output from the frequency detecting circuit 11 is transmitted through a controller 34 having signal transfer characteristics k1 up to the speaker 17 to the speaker 17. Canceling vibratory noise output from the speaker 17 is transmitted through the passenger compartment having signal transfer characteristics m1, which is to be controlled at the frequency of the reference signal x, to the microphone 18. The reference signal x is also transmitted through an unknown system 35 such as a vehicle body having signal transfer characteristics n1 to the microphone 18, which produces an error signal e.

The signal transfer characteristics k1 of the controller 34 for producing the canceling vibratory noise is expressed by:

$$k1=-n1/m1,$$

and the error signal e produced by the microphone 18 is expressed by:

$$e=n1\cdot x+k1\cdot m1\cdot x$$

The gradient Δ of a mean square error of the error signal e is expressed by the following equation (1):

$$\begin{aligned}\Delta &= \frac{\partial(e^2)}{\partial kl} \\ &= 2\cdot e\cdot\frac{\partial e}{\partial kl} \\ &= 2\cdot e\cdot ml\cdot x\end{aligned} \tag{1}$$

Figure 4:
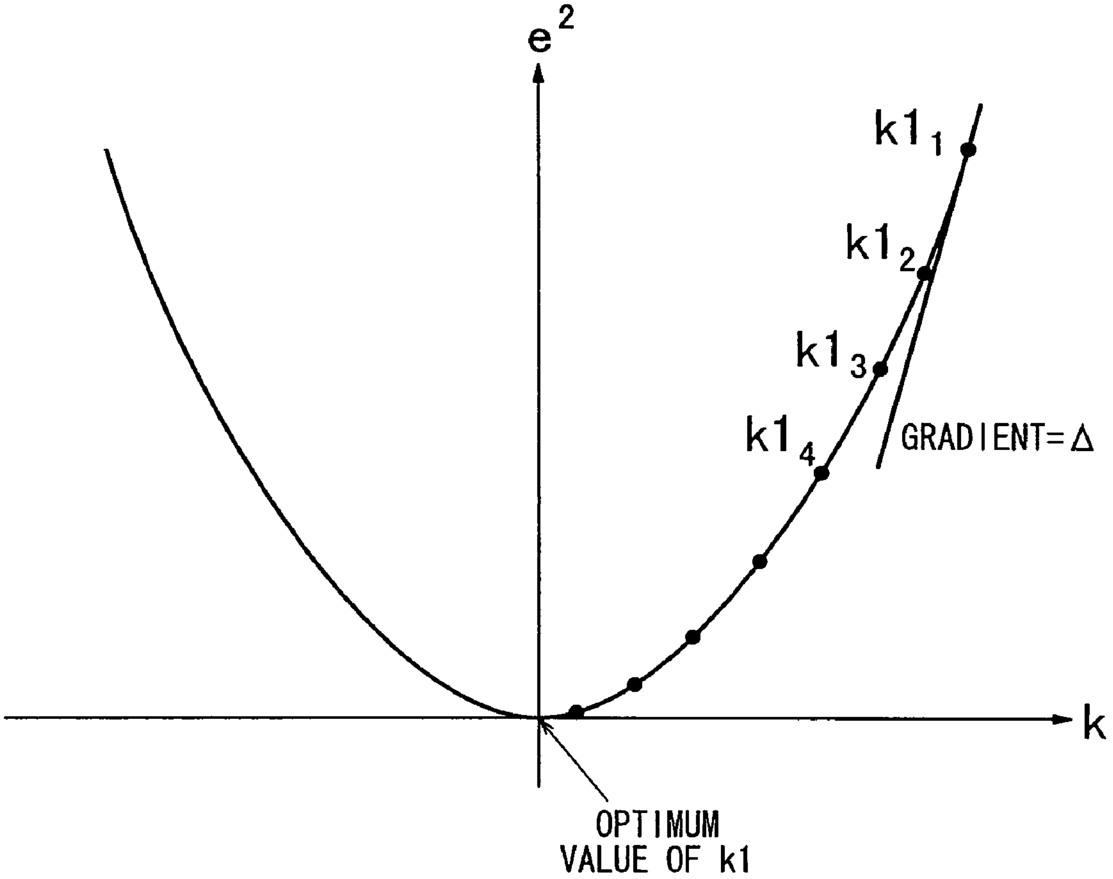
FIG. 4 is a diagram showing the relationship between signal transfer characteristics and an error signal for the muffled-sound canceling process of the active vibratory noise control apparatus according to the embodiment of the present invention.

Therefore, the gradient Δ of the mean square error of the error signal e which is produced under adaptive control is represented as shown in FIG. 4. In order to obtain an optimum value of the signal transfer characteristics k1 where the square error ($e^2$) is minimum, the equation (2), shown below, is repeatedly calculated. In the equation (2), n is an integer of 0 or more and represents the number of adaptive calculations which corresponds to a sampling pulse count (timing signal count) for sampling the reference cosine wave for A/D conversion and sampling the reference sine wave for A/D conversion, the number of adaptive calculations being incremented each time the filter coefficients are updated, and μ represents a step-size parameter. The equation (2) is an adaptive updating formula using LMS algorithm calculations, and serves to cancel vibratory noise according to an adaptive processing sequence.

$$k1_{n+1}=k1_n-\mu\cdot e_n\cdot m1\cdot x_n \tag{2}$$

Specifically, in the active vibratory noise control apparatus 10, the signal transfer characteristics k1 is expressed as a signal a (=coefficient a) and a signal b (=coefficient b) which are mutually orthogonal.

Generation of the cosine corrective value C0 and the sine corrective value C1 will be described below with reference to FIGS. 5A through 5D.

When instantaneous values of the reference cosine wave signal (hereinafter also referred to as reference wave cos) and the reference sine wave signal (hereinafter also referred to as reference wave sin), which are reference signals, are directly output respectively as the signals Cs, Sn a from the speaker 17, the reference waves cos, sin are transmitted to the microphone 18 according to the signal transfer characteristics from the speaker 17 to the microphone 18 which serves as an evaluating point. The process of how the reference waves cos, sin are changed when they reach the microphone 18 will be described below.

The signal transfer characteristics of the passenger compartment from the speaker 17 to the microphone 18 are divided into gain (amplitude change) and phase characteristics (phase lag).

The signal transfer characteristics from the speaker 17 to the microphone 18 are such that when the reference signals reach the microphone 18, the amplitude of these reference signals is multiplied by a and the phase thereof is delayed ϕ degrees. The reference signals as they have reached the microphone 18 are represented respectively by New_Cs, New_Sn.

Only a phase_lag(ϕ) with respect to a reference signal having a certain control frequency will be taken into account. The phase_lag(ϕ) corresponds to a rotation of the reference signal (vector) on a complex plane about the origin by ϕ. Therefore, taking into the phase_lag(ϕ) only, a linear transformation matrix $P'_{1m}(\phi)$ for rotating the vector by the phase_lag(ϕ) is expressed by the following equation (3):

$$P'_{lm}(\phi)=\begin{pmatrix}\cos\phi & i\sin\phi \\ i\sin\phi & \cos\phi\end{pmatrix} \tag{3}$$

where $P'_{1m}(\phi)$ is a transformation formula for signal transfer characteristics when only the phase_lag(ϕ) is taken into consideration, 1 the number of speakers (the number of vibratory noise canceling signals that are output), and m the number of microphones. If the number of speakers is 2 and the number of microphones is 2, then transformation matrixes $P'_{11}$, $P'_{12}$, $P'_{21}$, $P'_{22}$ are present in each signal transmission path.

A transformation formula $P_{1m}(\phi)$ for signal transfer characteristics when the gain(α) is also taken into account is expressed by the following equation (4):

$$P_{lm}(\phi)=\alpha\begin{pmatrix}\cos\phi & i\sin\phi \\ i\sin\phi & \cos\phi\end{pmatrix} \tag{4}$$

The transformation formula $P_{1m}(\phi)$ can also easily be understood from the above equation (4).

Figure 5A:
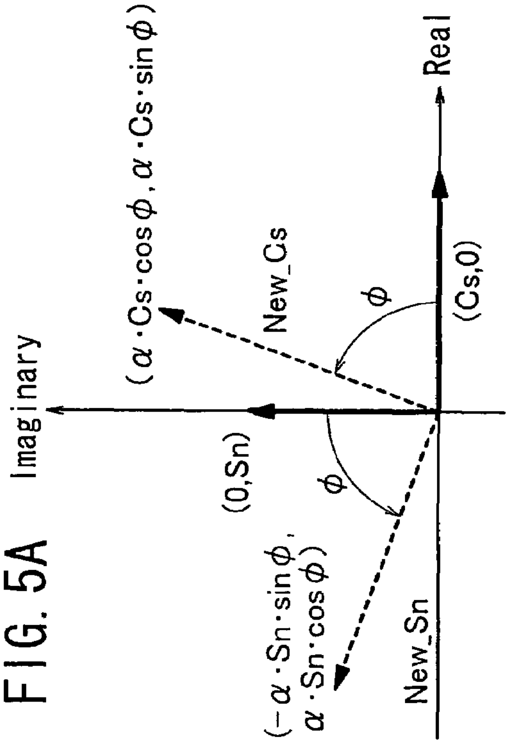
FIGS. 5A through 5D are diagrams illustrative of the muffled-sound canceling process of the active vibratory noise control apparatus according to the embodiment of the present invention.

When instantaneous values of the reference cosine wave signal and the reference sine wave signal are represented by the signals Cs, Sn indicated by the solid lines in FIG. 5A, also taking into account the gain(α) in the signal transfer characteristics, the broken lines in FIG. 5A represent the signals New_Cs, New_Sn which the signals Cs, Sn are turned into when they reach the microphone 18 through the passenger compartment having the signal transfer characteristics having the gain(α) and the phase_lag(ϕ).

That is, the reference cosine wave signal Cs and the reference sine wave signal Sn are turned respectively into the signals New_Cs, New_Sn by being multiplied by the gain α and rotated by the phase_lag(ϕ) when they reach the microphone 18.

The signals New_Cs, New_Sn are expressed respectively by the following equations (5), (6):

$$\text{New\_Cs;}\ \begin{pmatrix} Csr \\ Csi \end{pmatrix} = \alpha \begin{pmatrix} \cos\phi & i\sin\phi \\ i\sin\phi & \cos\phi \end{pmatrix} \begin{pmatrix} Cs \\ 0 \end{pmatrix} = \begin{pmatrix} \alpha\cdot Cs\cdot\cos\phi \\ i\alpha\cdot Cs\cdot\sin\phi \end{pmatrix} \quad (5)$$

$$\text{New\_Sn;}\ \begin{pmatrix} Snr \\ Sni \end{pmatrix} = \alpha \begin{pmatrix} \cos\phi & i\sin\phi \\ i\sin\phi & \cos\phi \end{pmatrix} \begin{pmatrix} 0 \\ iSn \end{pmatrix} = \begin{pmatrix} -\alpha\cdot Sn\cdot\sin\phi \\ i\alpha\cdot Sn\cdot\cos\phi \end{pmatrix} \quad (6)$$

If the signals New_Cs, New_Sn are represented as vectors, then they are expressed according to the equations (7) shown below, as shown in FIG. 5A.

$$\text{New\_}Cs=(\alpha\cdot Cs\cdot\cos\phi, i\alpha\cdot Cs\cdot\sin\phi)$$

$$\text{New\_}Sn=(-\alpha\cdot Sn\cdot\sin\phi, i\alpha\cdot Sn\cdot\cos\phi) \quad (7)$$

Based on the fact that muffled sounds are represented by a combination of the cosine wave signal and the sine wave signal, the active vibratory noise control apparatus 10 cancels the muffled sounds by sequentially updating the coefficient a on the real axis of a complex plane and the coefficient b on the imaginary axis of the complex plane as shown in FIG. 2 according to the LMS algorithm calculations in order to minimize the error signal e at the position of the microphone 18. The coefficient a on the real axis (see FIG. 2) is sequentially updated based on the signal on the real axis at the position of the microphone 18, and the coefficient b on the imaginary axis (see FIG. 2) is sequentially updated based on the signal on the imaginary axis at the position of the microphone 18, hereby suppressing vibratory noise. Therefore, it is necessary to determine the signal on the real axis and the signal on the imaginary axis from the signals New_Cs, New_Sn.

Now, a process of determining the coefficient a on the real axis and the coefficient b on the imaginary axis from the signals New_Cs, New_Sn will be described below.

Figure 5B:
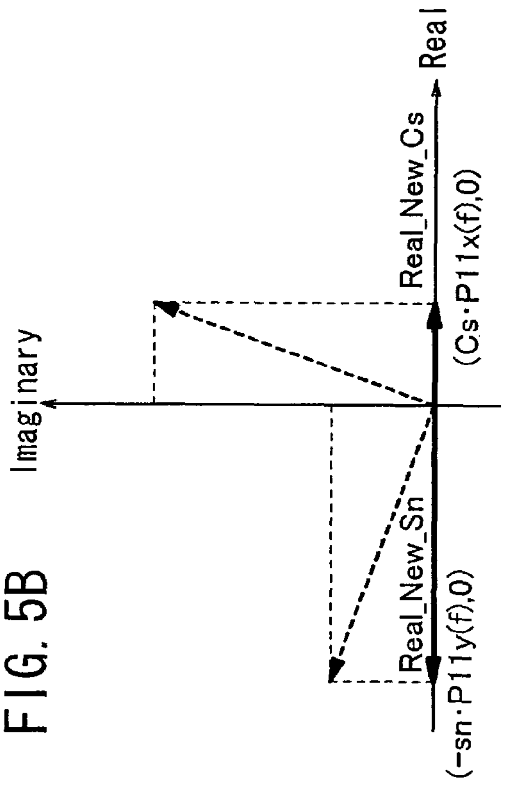
Figure 5C:
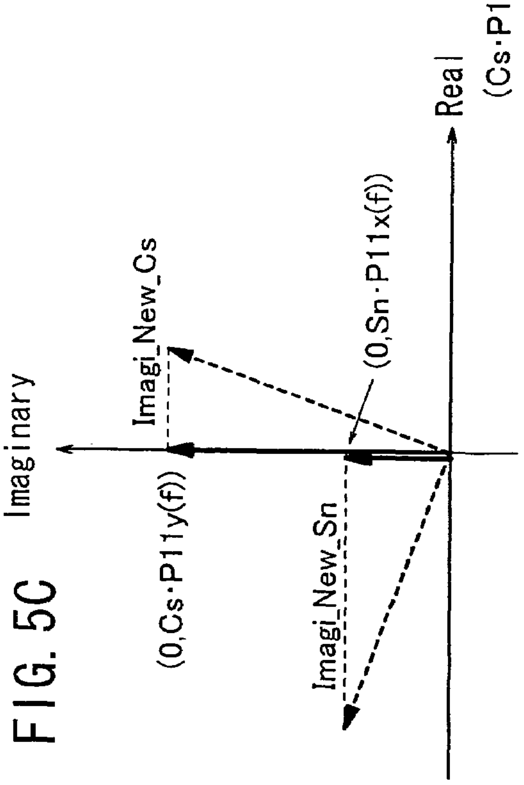

The magnitudes of real components included in the signals New_Cs, New_Sn are obtained by projecting those signals onto the real axis. Their values are represented by Real_New_Cs (also referred to as Real_Cs) and Real_New_Sn (also referred to as Real_Sn), respectively, as shown in FIG. 5B. The magnitudes of imaginary components included in the signals New_Cs, New_Sn are obtained by projecting those signals onto the imaginary axis. Their values are represented by Imagi_New_Cs (also referred to as Imagi_Cs) and Imagi_New_Sn (also referred to as Imagi_Sn), respectively, as shown in FIG. 5C.

Figure 5D:
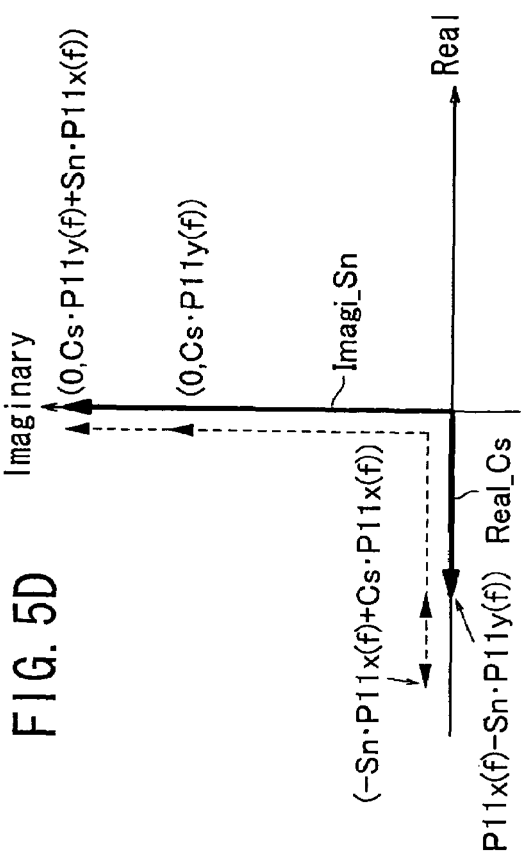

When the reference cosine wave signal Cs and the reference sine wave signal Sn are multiplied by the gain(α) and rotated by the phase_lag(φ) according to the signal transfer characteristics of the passenger compartment from the speaker 17 to the microphone 18, their real components and imaginary components are indicated by the broken lines in FIG. 5D. These real components and imaginary components are combined into Real_Cs, Imagi_Sn, respectively, as indicated by the solid lines in FIG. 5D.

The signals on the real and imaginary axes are determined by calculations as follows:

The signals produced on the real and imaginary axes by projecting the signal New_Cs onto the real and imaginary axes are represented by Real_New_Cs (vector RNCs) and Image_New_Cs (vector INCs), respectively. The signals produced on the real and imaginary axes by projecting the signal New_Sn onto the real and imaginary axes are represented by Real_New_Sn (vector RNSn) and Image_New_Sn (vector INSn), respectively. The signal Real_Cs on the real axis is represented by (vector RCs), the signal Imagi_Sn on the imaginary axis by (vector ISn), the signal New_Cs by (vector NSn), the signal Cs by (vector Cs), and the signal Sn by (vector Sn). In the equations shown below, a vector is indicated by an arrow as a hat.

The vector RCs is the sum of the vector RNCs and the vector RNSn, and the vector RNCs and the vector RNSn are produced by projecting the vector NCs or the vector NSn onto the vector Cs. Therefore, the vector RNCs and the vector RNSn are expressed by the following equations (8):

$$\left.\begin{aligned} \overrightarrow{RNCs} &= \frac{\overrightarrow{Cs}\times\overrightarrow{NCs}}{\overrightarrow{Cs}\times\overrightarrow{Cs}}\cdot\overrightarrow{Cs} \\ &= \frac{\alpha\cdot Cs^2\cdot\cos\phi}{Cs^2}\cdot\overrightarrow{Cs} = \alpha\cdot\cos\phi(Cs,0) \\ &= (\alpha\cdot Cs\cdot\cos\phi, 0) \\ \overrightarrow{RNSn} &= \frac{\overrightarrow{Cs}\times\overrightarrow{NSn}}{Cs\times Cs}\cdot\overrightarrow{Cs} = \frac{-\alpha\cdot Cs\cdot Sn\cdot\sin\phi}{Cs^2}\cdot\overrightarrow{Cs} \\ &= -\frac{-\alpha\cdot Sn}{Cs}\cdot\sin\phi(Cs,0) = (-\alpha\cdot Sn\cdot\sin\phi, 0) \end{aligned}\right\} \quad (8)$$

Therefore, the vector RCs is expressed by the following equation (9):

$$\begin{aligned} \overrightarrow{RCs} &= (\alpha\cdot Cs\cdot\cos\phi - \alpha\cdot Sn\cdot\sin\phi, 0) \\ &= \alpha(Cs\cdot\cos\phi - Sn\cdot\sin\phi, 0) \end{aligned} \quad (9)$$

Since the vector ISn is the sum of the vector INCs and the vector INSn, and the vector INCs and the vector INSn are produced by projecting the vector NCs or the vector NSn onto the vector Sn, the vector INCs and the vector INSn are expressed by the following equations (10):

$$\left.\begin{aligned} \overrightarrow{INCs} &= \frac{\overrightarrow{Sn}\times\overrightarrow{NCs}}{\overrightarrow{Sn}\times\overrightarrow{Sn}}\cdot\overrightarrow{Sn} = \frac{-\alpha\cdot Cs\cdot Sn\cdot\sin\phi}{-Sn^2}\cdot\overrightarrow{Sn} \\ &= \frac{\alpha\cdot Cs}{Sn}\cdot\sin\phi(0, iSn) = (0, i\alpha\cdot Cs\cdot\sin\phi) \\ \overrightarrow{INSn} &= \frac{\overrightarrow{Sn}\times\overrightarrow{NSn}}{\overrightarrow{Sn}\times\overrightarrow{Sn}}\cdot\overrightarrow{Sn} = \frac{-\alpha\cdot Sn^2\cdot\cos\phi}{-Sn^2}\cdot\overrightarrow{Sn} \\ &= \alpha\cdot\cos\phi(0, iSn) = (0, i\alpha\cdot Sn\cdot\cos\phi) \end{aligned}\right\} \quad (10)$$

Therefore, the vector RCs is expressed by the following equation (11):

$$\begin{aligned} \overrightarrow{ISn} &= (0, i[\alpha\cdot Cs\cdot\sin\phi + \alpha\cdot Sn\cdot\cos\phi]) \\ &= i\alpha(0, Cs\cdot\sin\phi + Sn\cdot\cos\phi) \end{aligned} \quad (11)$$

The signal transfer characteristics are a function of the frequency of the output sound from the speaker 17. The signal transfer characteristics are thus expressed using complex numbers, as follows:

$$P_{lm}(f)=P_{lmx}(f)+iP_{lmy}(f)$$

$$P_{lmx}(f)=\alpha(f)\cdot\cos\phi(f)$$

$$P_{lmy}(f)=\alpha(f)\cdot\sin\phi(f)$$

If the full control frequency range of the reference signals is taken into consideration, then the vector RCs and the vector ISn are expressed by the equations (12) shown below (see FIG. 5D). These vectors represent the real and imaginary components of the finally combined signal.

$$\overrightarrow{RCs}=(Cs\cdot P_{lmx}(f)-Sn\cdot P_{lmy}(f),0)$$

$$\overrightarrow{ISn}=(0,i[Cs\cdot P_{lmy}(f)+Sn\cdot P_{lmx}(f)]) \quad (12)$$

From the above equations, the first reference signal $r_x(f)$ which is used to update the filter coefficients (corresponding to the coefficient a in FIG. 2) of the adaptive notch filter 14 is expressed as follows:

$$r_x(f)=Cs\cdot P_{lmx}(f)-Sn\cdot P_{lmy}(f)$$

The second reference signal $r_y(f)$ which is used to update the filter coefficients (corresponding to the coefficient b in FIG. 2) of the adaptive notch filter 15 is expressed as follows:

$$r_y(f)=Cs\cdot P_{lmy}(f)+Sn\cdot P_{lmx}(f)$$

Inasmuch as the signal Cs is an instantaneous value of the reference cosine wave signal and the signal Sn is an instantaneous value of the reference sine wave signal, the reference signals are given as indicated by the equations (13) shown below, and the active vibratory noise control apparatus 10 is of the arrangement shown in FIG. 1.

$$\left.\begin{aligned} r_x(f) &= P_{lmx}(f)\cdot cos2\pi ft - P_{lmy}(f)\cdot sin2\pi ft \\ r_y(f) &= P_{lmy}(f)\cdot cos2\pi ft + P_{lmx}(f)\cdot sin2\pi ft \end{aligned}\right\} \quad (13)$$

The reference signals $r_x(f)$, $r_y(f)$ represented by the equations (13) are expressed using n referred to above, as follows: The reference signals $r_x(f,n)$, $r_y(f,n)$ are given by the following equations (14), from $P_{lm}(f)=\alpha(f)\cdot\cos\phi(f)$ and $P_{lm}(f)=\alpha(f)\cdot\sin\phi(f)$:

$$\begin{aligned} r_x(f,n) &= P_{lmx}(f)\cdot\cos2\pi(f,n) - P_{lmy}(f)\cdot\sin2\pi(f,n) \quad (14) \\ &= \alpha(f)[\cos(\phi(f))\cdot\cos2\pi\ f,n) - \sin(\phi(f))\cdot\sin2\pi\ f,n)] \\ r_y(f,n) &= P_{lmy}(f)\cdot\cos2\pi(f,n) + P_{lmx}(f)\cdot\sin2\pi(f,n) \\ &= \alpha(f)[\sin(\phi(f))\cdot\cos2\pi\ f,n) + \cos(\phi(f))\cdot\sin2\pi\ f,n)] \end{aligned}$$

where $\alpha(f)$ represents a gain, which may be a coefficient with respect to $\cos(\phi(f))$, $\sin(\phi(f))$. Therefore, the cosine corrective value C0 is represented by $\alpha(f)\cdot\cos(\phi(f))$ and the sine corrective value C1 is represented by $\alpha(f)\cdot\sin(\phi(f))$. The cosine corrective value C0 and the sine corrective value C1 may be measured in advance for each control frequency as a cosine corrective value based on the cosine value of a phase lag and a sine corrective value based on the sine value of the phase lag, and stored in advance in the memories 22, 23 in association with the control frequency f of the reference signals.

From FIG. 4, equations for updating the filter coefficients are provided as $a_1(n+1)=a_1(n)-\mu\cdot e_m(n)\cdot r_x(f,n)$ and $b_1(n+1)=b_1(n)-\mu\cdot e_m(n)\cdot r_y(f,n)$ by replacing klm with $a_1(n)$, $b_1(n)$, kl with a and b, and ml·x with r(f,n) in the equation (2). Based on the reference signal $r_x(f,n)$, the former equation is given as the equation (15-1) shown below, and based on the reference signal $r_y(f,n)$, the latter as the equation (15-2) shown below.

$$\begin{aligned} a_1(n+1) &= a_1(n) - \mu\cdot e_m(n)\cdot\alpha(f)[\cos(\phi(f))\cdot\cos2\pi(f,n) - \\ &\quad \sin(\phi(f))\cdot\sin2\pi(f,n)] \\ &= a_1(n) - \mu'(f)\cdot e_m(n)[\cos(\phi(f))\cdot\cos2\pi(f,n) - \\ &\quad \cos(\phi(f))\cdot\sin2\pi(f,n)] \end{aligned} \quad (15\text{-}1)$$

$$\begin{aligned} b_1(n+1) &= b_1(n) - \mu\cdot e_m(n)\cdot\alpha(f)[\sin(\phi(f))\cdot\cos2\pi(f,n) + \\ &\quad \cos(\phi(f))\cdot\sin2\pi(f,n)] \\ &= b_1(n) - \mu'(f)\cdot e_m(n)[\sin(\phi(f))\cdot\cos2\pi(f,n) + \\ &\quad \cos(\phi(f))\cdot\sin2\pi(f,n)] \end{aligned} \quad (15\text{-}2)$$

From the above equation (14), $\alpha(f)$ which reflects the gain of the signal transfer characteristics in the reference signal $r_x(f,n)$ and the reference signal $r_y(f,n)$ can be a coefficient for each frequency, and is synonymous with changing from a constant step size parameter μ to a step size parameter μ' at each control frequency as indicated by the equations (15-1), (15-2). This also means that the reference signal $r_x(f,n)$ and the reference signal $r_y(f,n)$ may accurately reflect only the phase_lag(φ) of the signal transfer characteristics, and that $\alpha(f)$ which reflects the gain of the signal transfer characteristics can be substituted for an adjusting element at each control frequency.

In the active vibratory noise control apparatus 10, as described above, the frequency of the reference cosine wave signal, the frequency of the reference sine wave signal, the cosine corrective value C0, and the sine corrective value C1 change based on the rotational speed of the engine output shaft, and the notch frequencies of the adaptive notch filters 14, 15 operate in the same manner as if they virtually change based on the rotational speed of the engine output shaft, canceling the muffled sounds.

In the active vibratory noise control apparatus 10, furthermore, since the signal transfer characteristics is optimally modeled using the cosine corrective value C0 and the sine corrective value C1, and the muffled sounds are canceled using the adaptive notch filters, the contours of constant square error curves become concentric circles, converging the cancellation of vibratory noise quickly.

The active vibratory noise control apparatus 10 as it is incorporated in a vehicle will be described below by way of specific example.

Figure 6:
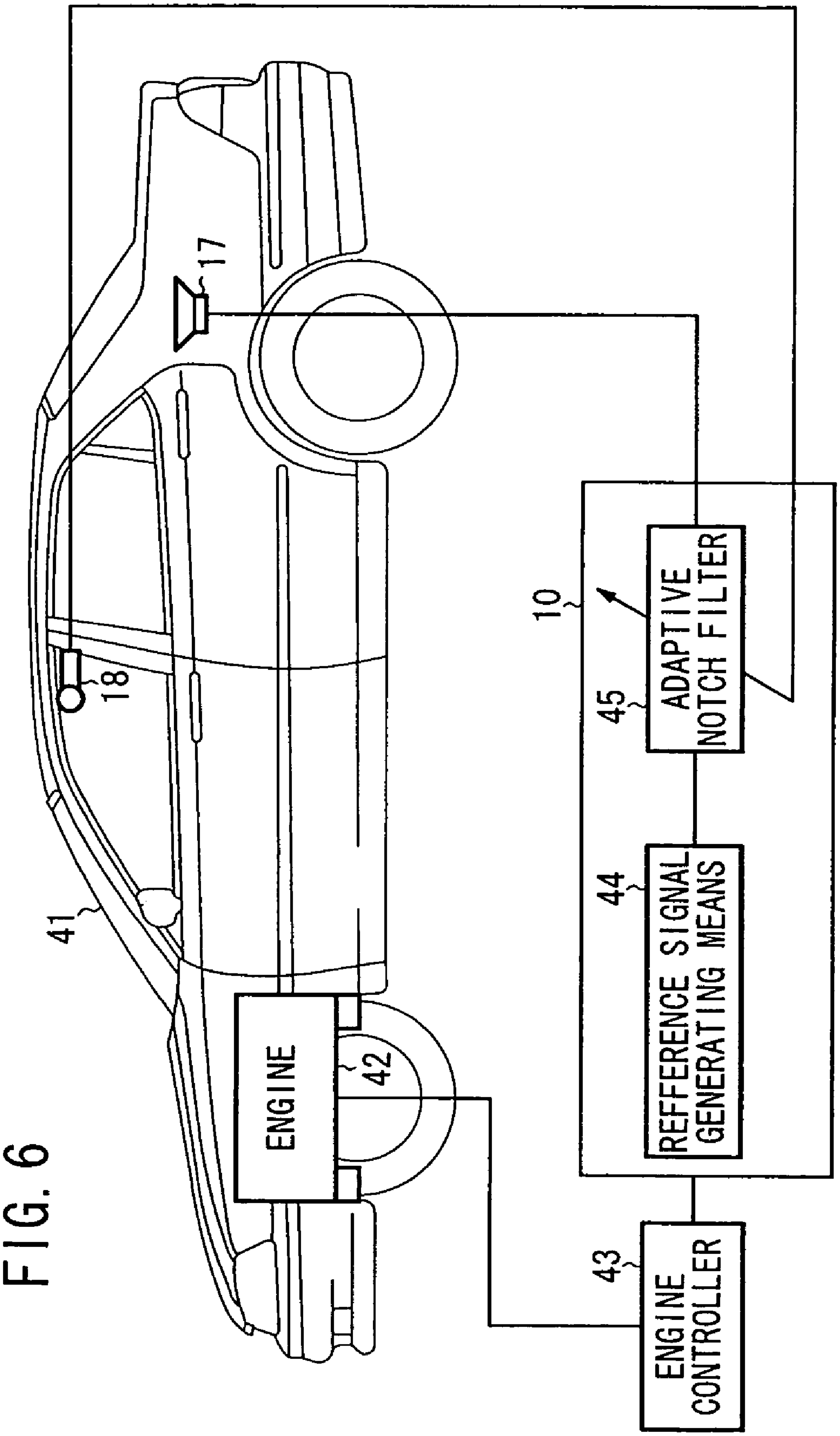
FIG. 6 is a block diagram showing a system in which the active vibratory noise control apparatus according to the embodiment of the present invention is incorporated in a vehicle.

FIG. 6 shows in block form a system in which the active vibratory noise control apparatus 10 with one microphone is incorporated in a vehicle for canceling muffled sounds in the passenger compartment of the vehicle.

In FIG. 6, the active vibratory noise control apparatus 10 has primary components which are functionally implemented by an inexpensive microcomputer. In FIG. 6, the frequency detecting circuit 11, the cosine wave generating circuit 12, and the sine wave generating circuit 13 shown in FIG. 1 are represented by a reference signal generating means 44, and the first adaptive notch filter 14, the second adaptive notch filter 15, the reference signal generating circuit 20, and the LMS algorithm processors 30, 31 shown in FIG. 1 are represented by an adaptive notch filter 45. The D/A converter, the low-pass filter, the amplifier, the band-pass filter, and the A/D converter shown in FIG. 1 are omitted from illustration in FIG. 6, and also omitted from illustration in FIGS. 12 and 13 to be described later.

The speaker 17 is disposed in a given position behind the rear seats in a vehicle 41, and the microphone 18 is disposed on a central portion of the ceiling of the passenger compartment of the vehicle 41. The microphone 18 may alternatively be placed in the instrumental panel rather than on the ceiling of the passenger compartment.

Engine pulses output from an engine controller 43 which controls an engine 42 of the vehicle 41 are input to the active vibratory noise control apparatus 10 which coacts with the speaker 17 and the microphone 18. The adaptive notch filter 45 which is adaptively controlled to minimize an output signal from the microphone 18 applies an output signal to energize the speaker 17 to cancel vibratory noise in the passenger compartment of the vehicle 41. The process of canceling vibratory noise has already been described above with respect to the active vibratory noise control apparatus 10.

Measured values of the gain and phase lag in the signal transfer characteristics at various frequencies in the passenger compartment between the speaker 17 and the microphone 18 are shown in FIGS. 7A through 7D. The measured values of the gain and the phase lag at the various frequencies are shown in the form of a table in FIG. 7C. In FIG. 7C, the gain is indicated in dB, and the phase_lag($\phi$) in an angle ($0° \leqq \phi \leqq 360°$).

Figure 8:
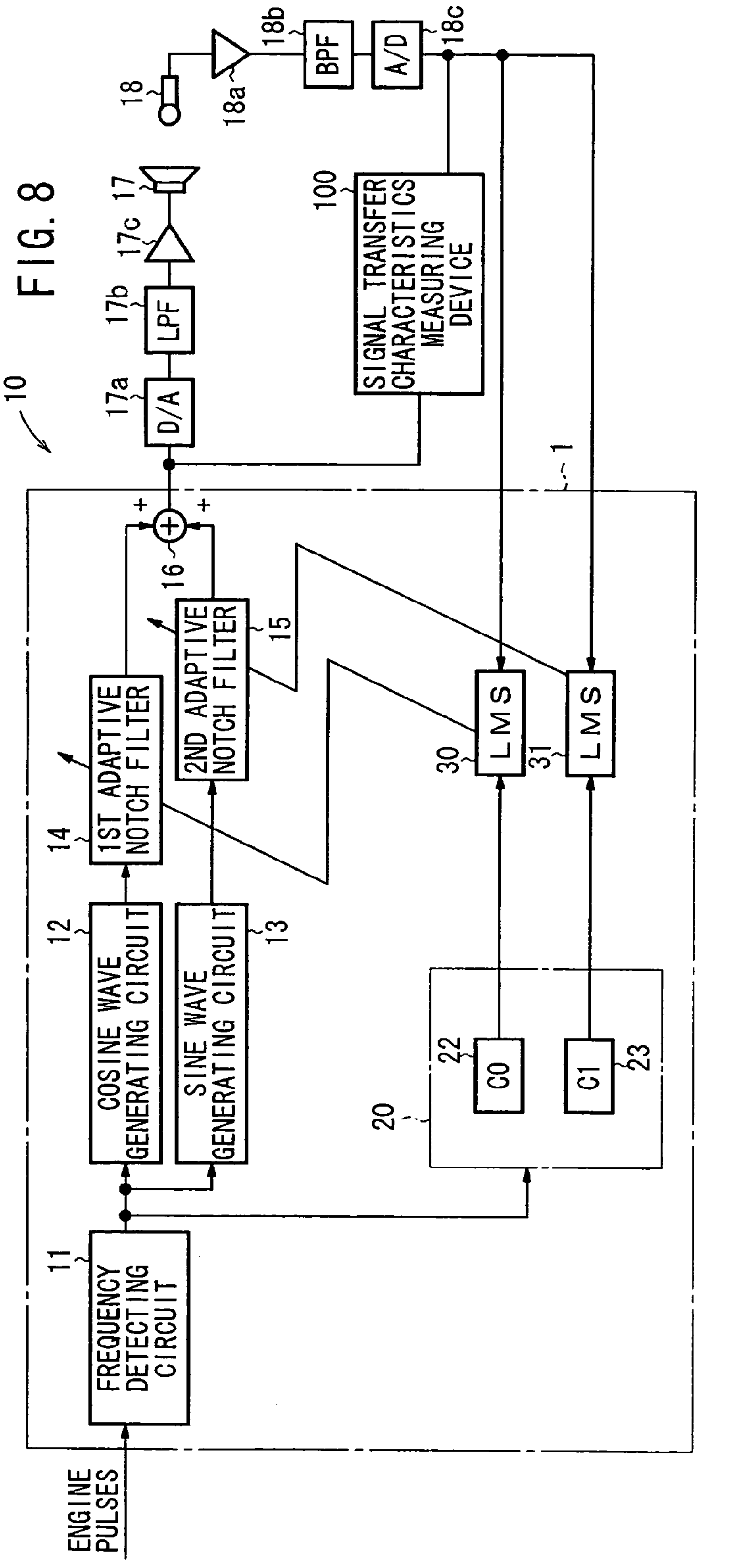
FIG. 8 is a block diagram of a system for measuring signal transfer characteristics of the active vibratory noise control apparatus according to the embodiment of the present invention.

In the description so far, the signal transfer characteristics are given as being present between the speaker 17 and the microphone 18 in the passenger compartment. Actually, as shown in FIG. 8, the signal transfer characteristics is measured by a signal transfer characteristics measuring device 100 comprising a Fourier transform device which is connected to the active vibratory noise control apparatus 10. Specifically, the signal transfer characteristics measuring device 100 measures the signal transfer characteristics based on a signal which is output from the microcomputer 1 to the speaker 17 and a signal which is input from the microphone 18 to the microcomputer 1.

Therefore, depending on the process of measuring the signal transfer characteristics, the signal transfer characteristics between the speaker 17 and the microphone 18 in the passenger compartment includes those characteristics which are caused by analog circuits inserted between the output and input of the microcomputer 1, e.g., the speaker 17, the microphone 18, the D/A converter 17*a*, the low-pass filter 17*b*, the amplifier 17*c*, the amplifier 18*a*, the bandpass filter 18*b*, and the A/D converter 18*c*.

Stated otherwise, depending on the process of measuring the signal transfer characteristics, the signal transfer characteristics between the speaker 17 and the microphone 18 in the passenger compartment becomes signal transfer characteristics from the outputs of the adaptive notch filters to the inputs of the LMS algorithm processors 30, 31 (=filter coefficient updating means).

Cosine corrective values C0 ($P_{1mx}=P_{11x}=\alpha\cos\phi$) and sine corrective values C1 ($P_{1my}=P_{11y}=\alpha\sin\phi$) which represent $\alpha\cos\phi$ and $\alpha\sin\phi$ calculated at the respective control frequencies based on the measured values of the gain and the phase_lag($\phi$) are shown in association with the respective control frequencies in FIG. 7D. The cosine corrective values C0 and the sine corrective values C1 shown in FIG. 7D are stored in the memories 22, 23 in association with the frequencies of the reference signals.

In the embodiment of the present invention, muffled sounds of the engine are canceled in the vehicle 41 on which the 4-cycle 4-cylinder engine is mounted. Therefore, the control frequency ranges from 40 Hz to 200 Hz as rotational secondary components corresponding to engine rotational speeds from 1200 rpm to 6000 rpm. In view of the possibility of malfunctioning of the microcomputer serving as the active vibratory noise control apparatus 10 (hereinafter also referred to as vibratory noise control microcomputer), the signal transfer characteristics is measured in a control frequency range from 30 Hz to 230 Hz, and cosine corrective values C0 and sine corrective values C1 are stored in the control frequency range from 30 Hz to 230 Hz, as shown in FIG. 7D.

If a frequency value outside of the control frequency range were determined as a result of reference signal frequency calculations, then the cosine corrective values C0 and the sine corrective values C1 would not be read, and the microcomputer for vibratory noise control would run out of control. The corrective values are stored in the above wider control frequency range in order to prevent the microcomputer from running out of control.

In the embodiment of the present invention, since an 8-bit microcomputer is used as the microcomputer 1 in the process of calculating the values shown in FIG. 7D from the values shown in FIG. 7C, the gain($\alpha$) used in the calculations is set to $\alpha=127$ when the measurement gain is 0 (dB).

Therefore, when the amplification degree is A, since the gain=20 log A, the (gain/20)th power of 10=A. If the gain=−6, the gain($\alpha$)=$\alpha\times A=127\times(-6/20)$th power of 10=63.651.

The active vibratory noise control apparatus 10 constructed above was incorporated in the vehicle 41, reference signals were generated using the cosine corrective values C0 and the sine corrective values C1 shown in FIG. 7D, and muffled sounds of the engine were canceled by canceling vibratory noise (vibratory noise canceling signal) which was generated through the adaptive notch filters. The results of the muffled sounds cancellation as plotted against rotational speeds of the engine output shaft are indicated by the solid-line curve in FIG. 9A. The muffled sounds which were not canceled are indicated by the broken-line curve in FIG. 9A. A comparison between the solid-line curve and the broken-line curve in FIG. 9A clearly shows that muffled sounds were sufficiently canceled by the active vibratory noise control apparatus 10.

Figure 9B:
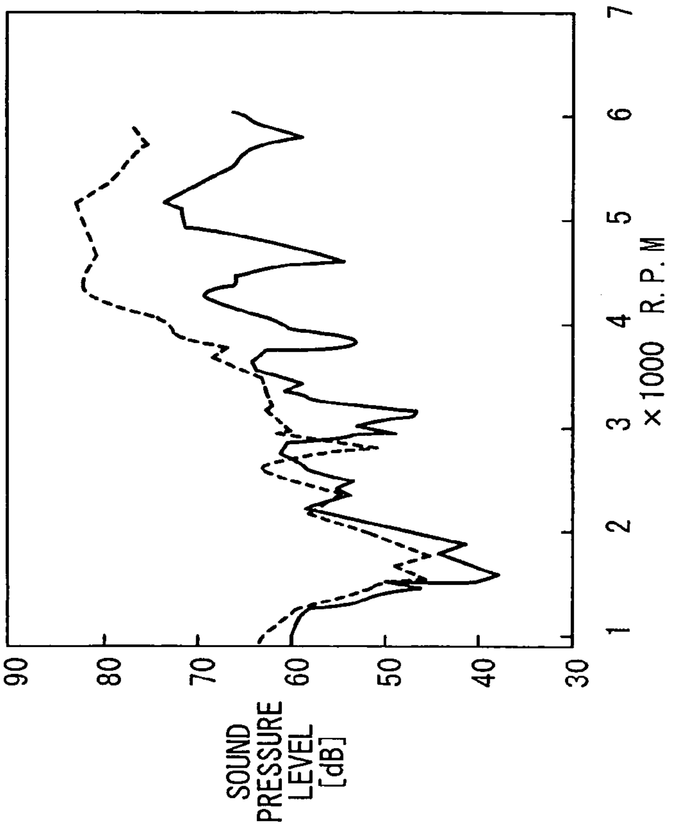
FIGS. 9A and 9B are diagrams showing results of the muffled-sound canceling process of the active vibratory noise control apparatus according to the embodiment of the present invention.
Figure 9A:
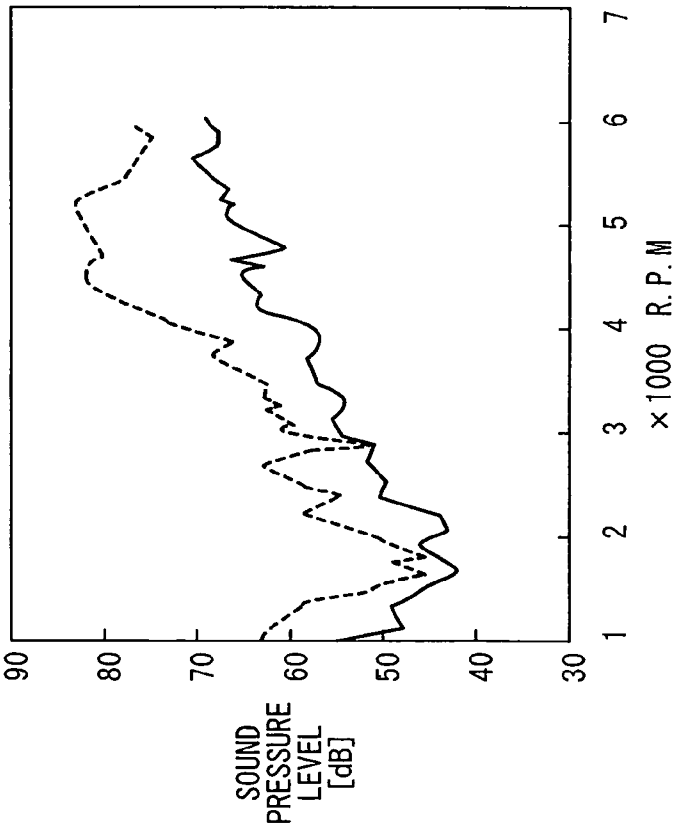

The solid-line curve shown in FIG. 9B was plotted when the signal transfer characteristics was modeled with the FIR filter described in Japanese laid-open patent publication No. 1-501344, and muffled sounds were canceled by a muffled sound canceling signal generated by the one-speaker, one-microphone active vibratory noise control apparatus with the adaptive FIR filter. The broken-line curve shown in FIG. 9B was plotted when muffled sounds were not canceled.

It can be seen from the foregoing that good canceling results are achieved by modeling the signal transfer characteristics using the cosine corrective values C0 and the sine corrective values C1 and canceling muffled sounds using the adaptive notch filters.

With respect to the amount of calculations required for the active vibratory noise control apparatus 10 to model the signal transfer characteristics using the cosine corrective values C0 and the sine corrective values C1 and cancel muffled sounds using the adaptive notch filters, four multiplications and two additions may be made in order to determine the reference signals expressed by the equation (14) in each adaptive processing cycle, and eight multiplications and four additions may be made for an adaptive processing sequence using the LSM algorithm calculations according to the equations (15-1), (15-2). Therefore, the number of calculations required by the active vibratory noise control apparatus 10 is small.

With the active vibratory noise control apparatus disclosed in Japanese laid-open patent publication No. 1-501344, since it performs convolutional calculations, if the number of taps of the FIR filter which models the signal transfer characteristics is j=128 and the number of taps of the adaptive FIR filter is i=64, then 128 multiplications and 127 additions need to be made to determine reference signals, 193 multiplications and 192 additions need to be made for an adaptive processing sequence, and 64 multiplications and 63 additions need to be made for outputting the results. Because of the large number of calculations required, the active vibratory noise control apparatus cannot be implemented by an inexpensive microcomputer, but needs to be implemented by a DSP (digital signal processor), and is hence expensive to manufacture.

As shown in FIG. 7C, the gain in the measured signal transfer characteristics in the reference signal frequency range from 30 Hz to 41 Hz ranges from −30 dB to −20 dB, which is smaller than a gain range in another reference signal frequency range from 42 Hz to 230 Hz. Therefore, the value of the gain(α) varies in a large range in FIG. 7C. If cosine corrective values C0 and sine corrective values C1 are determined using the values shown in FIG. 7C by a microcomputer whose calculated results have 8 bits, then the cosine corrective values C0 and the sine corrective values C1 include a gain variation range and variation ranges of cosine and sine values based on the phase_lag(ϕ). An inexpensive 8-bit microcomputer generally does not perform calculations with an exponential representation of values. Therefore, if the cosine corrective values C0 and the sine corrective values C1 have a large variation range, then figure canceling occurs because of the number of effective figures while the inexpensive 8-bit microcomputer is performing a process of calculating first and second reference numbers or an LMS processing sequence, resulting in a reduction in the accuracy with which to calculate the first and second reference signals or the filter coefficients of the first and second adaptive notch filers 14, 15, and hence in a reduction in the sound silencing capability.

As described above in relation to the equations (15-1), (15-2), since the gain(α) is substituted for the step size parameter μ' at each control frequency, a small value of the gain(α) is equivalent to a small value of the step size parameter μ', and hence the speed at which the filter coefficients are converged is lowered, resulting in poorer responsiveness.

A process of increasing the calculating accuracy and converging speed in the low frequency band by changing only the gain, but not changing the measured phase_lag(ϕ) in the low frequency range from 30 Hz to 41 Hz, based on the idea that the cosine corrective values C0 and the sine corrective values C1 are values based on the cosine and size values of the phase_lag(ϕ) of the reference signals and the gain(α) is an adjusting element at each control frequency, as described above in relation to the equations (14), (15-1), (15-2), will be described below.

The gain in the measured signal transfer characteristics in the reference signal frequency range from 30 Hz to 41 Hz is increased from the value shown in FIGS. 7A and 7C to a value close to the gain at the reference signal frequency of 42 Hz, e.g., −10 dB, as shown in FIGS. 10A and 10C, and cosine corrective values C0 and sine corrective values C1 are determined. The phase_lag(ϕ) used in this calculating process is not corrected as shown in FIGS. 10B and 10C, but is the measured phase_lag(ϕ) as shown in FIGS. 10B and 10C like the one shown in FIGS. 7B and 7C. Therefore, the value of the gain(α) has a small variation range, the accuracy with which to calculate cosine corrective values C0 and sine corrective values C1 with the 8-bit microcomputer in the frequency range from 30 Hz to 41 Hz is about the same as the accuracy with which to calculate cosine corrective values C0 and sine corrective values C1 in the frequency range from 42 Hz to 230 Hz, and the converging speed in the reference signal frequency range from 30 Hz to 41 Hz is increased.

The calculated cosine corrective values C0 and sine corrective values C1 are shown in FIG. 10D. FIG. 10A shows the measured and corrected gains (the broken-line curve shows the measured gain), and FIG. 10B shows the measured phase_lag(ϕ). Since the measured phase_lag(ϕ) is used as the phase_lag(ϕ), it does not affect the cancellation of muffled sounds.

In calculations for determining cosine corrective values C0 and sine corrective values C1, the above instance of correcting the gain(α) is expanded to make the value of the gain(α) an upper limit value based on the number of bits of the microcomputer used in the calculations. In this manner, the accuracy of the calculations can be increased.

Specifically, when cosine corrective values C0 and sine corrective values C1 are determined at respective frequencies by setting the gain to 0 dB to set the gain(α) to α=127, the cosine corrective values C0 and the sine corrective values C1 thus determined at respective frequencies are as shown in FIG. 11D. FIG. 11A shows the corrected gain (the broken-line curve shows the measured gain), and FIG. 11B shows the measured phase lag(ϕ). FIG. 11C shows a table of values of the corrected gain(α) and the measured phase_lag (ϕ). In this example, the calculating accuracy is prevented from varying due to the varying values of the gain(α) by making the gain constant in the full frequency range, and the calculating accuracy is increased and the converging speed is also increased by setting the gain to an upper limit value that is determined by the bits of the computer used for calculations.

A first modified system in which the active vibratory noise control apparatus 10 is incorporated in a vehicle 51 will be described below with reference to FIG. 12.

Figure 12:
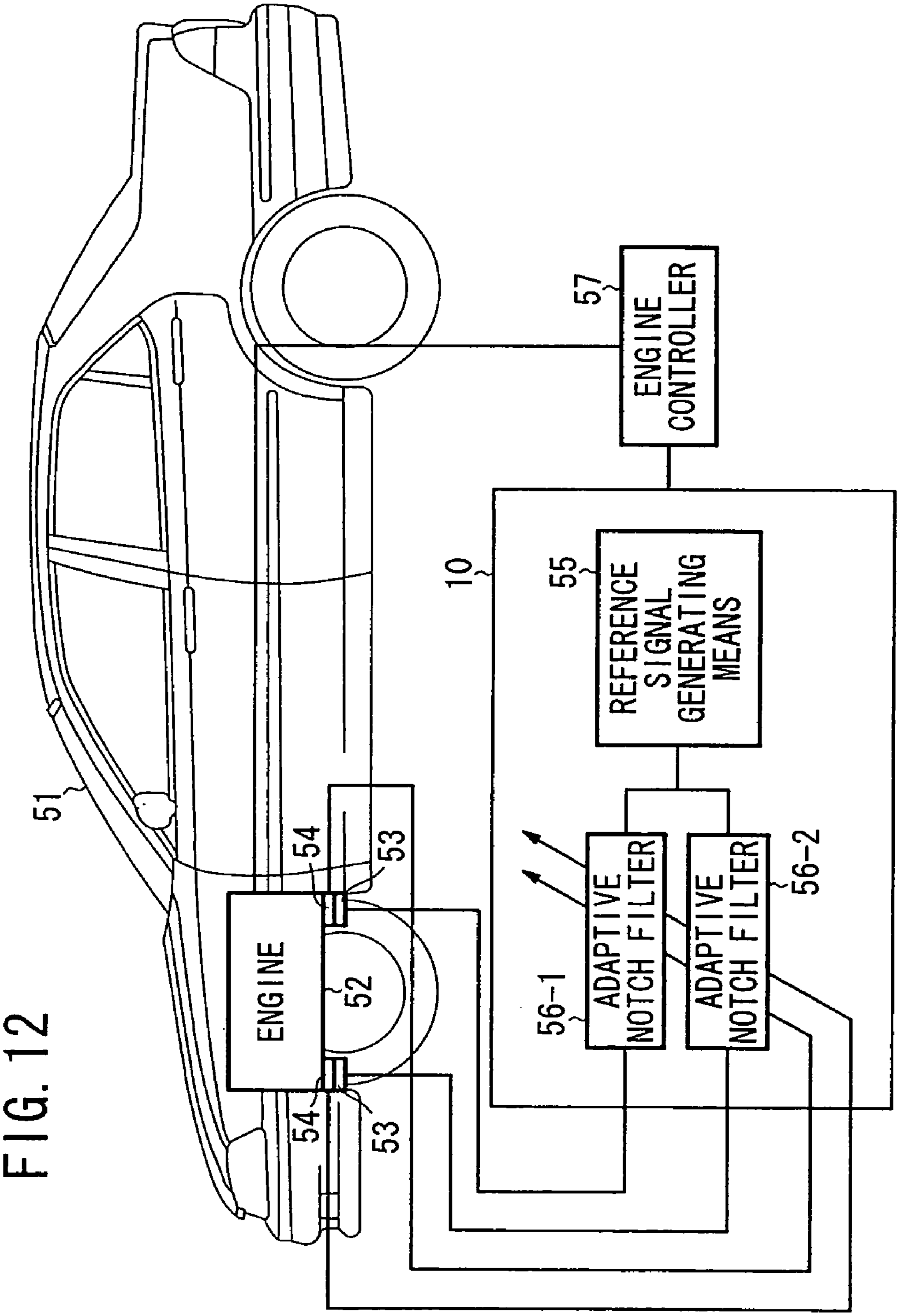
FIG. 12 is a block diagram showing a first modified system in which the active vibratory noise control apparatus according to the embodiment of the present invention is incorporated in the vehicle.

FIG. 12 schematically shows an arrangement for canceling vibratory noise produced by the engine with engine mounts.

In the first modified system, self-expandable/contractible engine mounts 53 for supporting the engine 52 of the engine 51 are used instead of the speaker 17, and vibration detecting sensors 54 disposed near the engine mounts 53 are used instead of the microphone 18.

In FIG. 12, the active vibratory noise control apparatus 10 comprises an 8-bit microcomputer, for example, and is represented by a reference signal generating means 55 and adaptive notch filters 56-1, 56-2.

Engine pulses output from an engine controller 57 which controls the engine 52 of the vehicle 51 are input to the active vibratory noise control apparatus 10 which coacts with the engine mounts 53 and the vibration detecting sensors 54. The adaptive notch filter 56-1, 56-2 whose filter coefficients are adaptively controlled to minimize output signals from the vibration detecting sensors 54, i.e., to minimize an error signal apply output signals to actuate the engine mounts 53 separately from each other to cancel vibratory noise and muffled sounds in the passenger compartment. The process of canceling vibratory noise and muffled sounds has already been described above with respect to the active vibratory noise control apparatus 10.

A second modified system in which the active vibratory noise control apparatus 10 is incorporated in a vehicle 61 will be described below with reference to FIG. 13.

Figure 13:
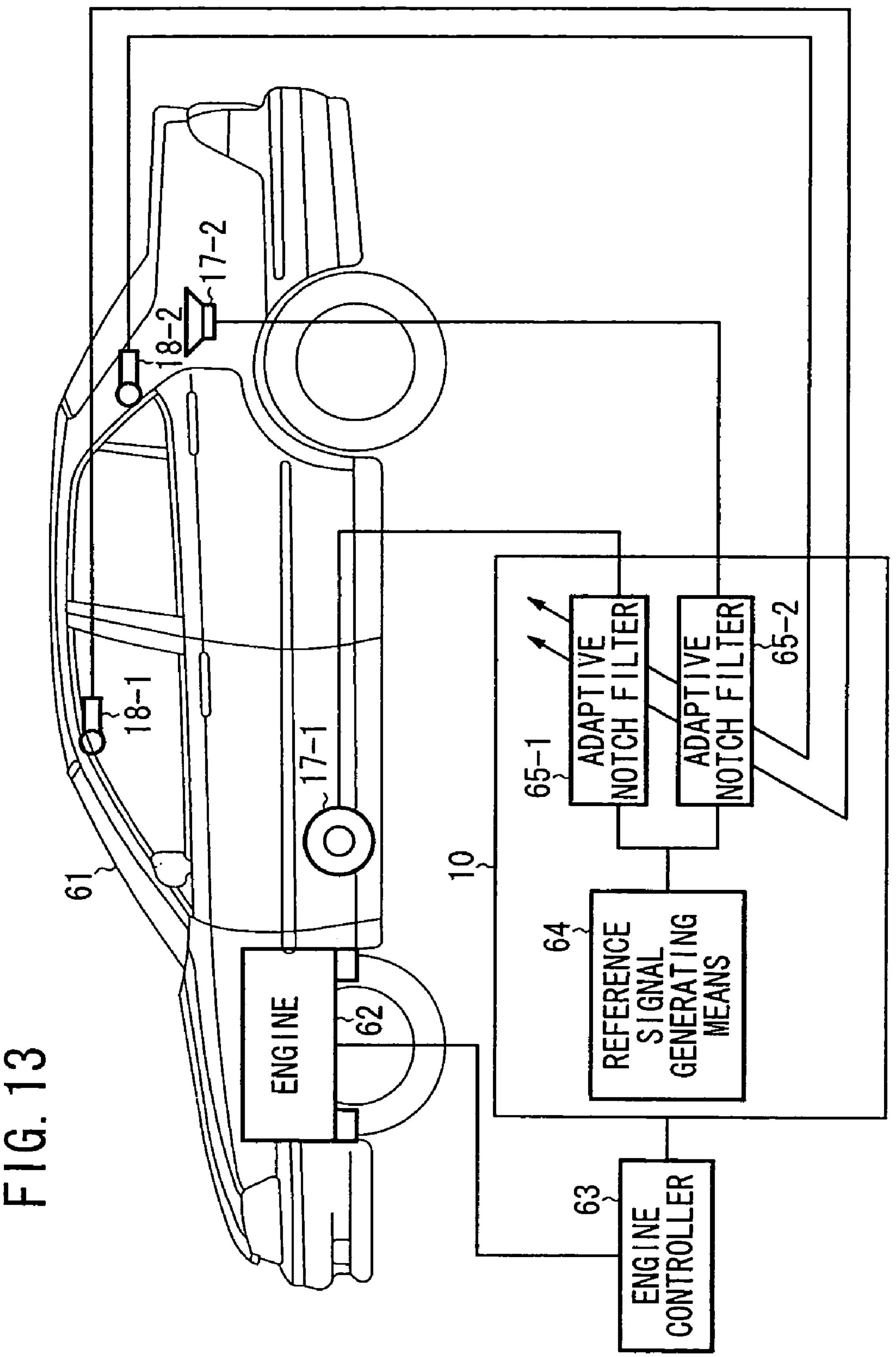
FIG. 13 is a block diagram showing a second modified system in which the active vibratory noise control apparatus according to the embodiment of the present invention is incorporated in the vehicle.
Figure 14:
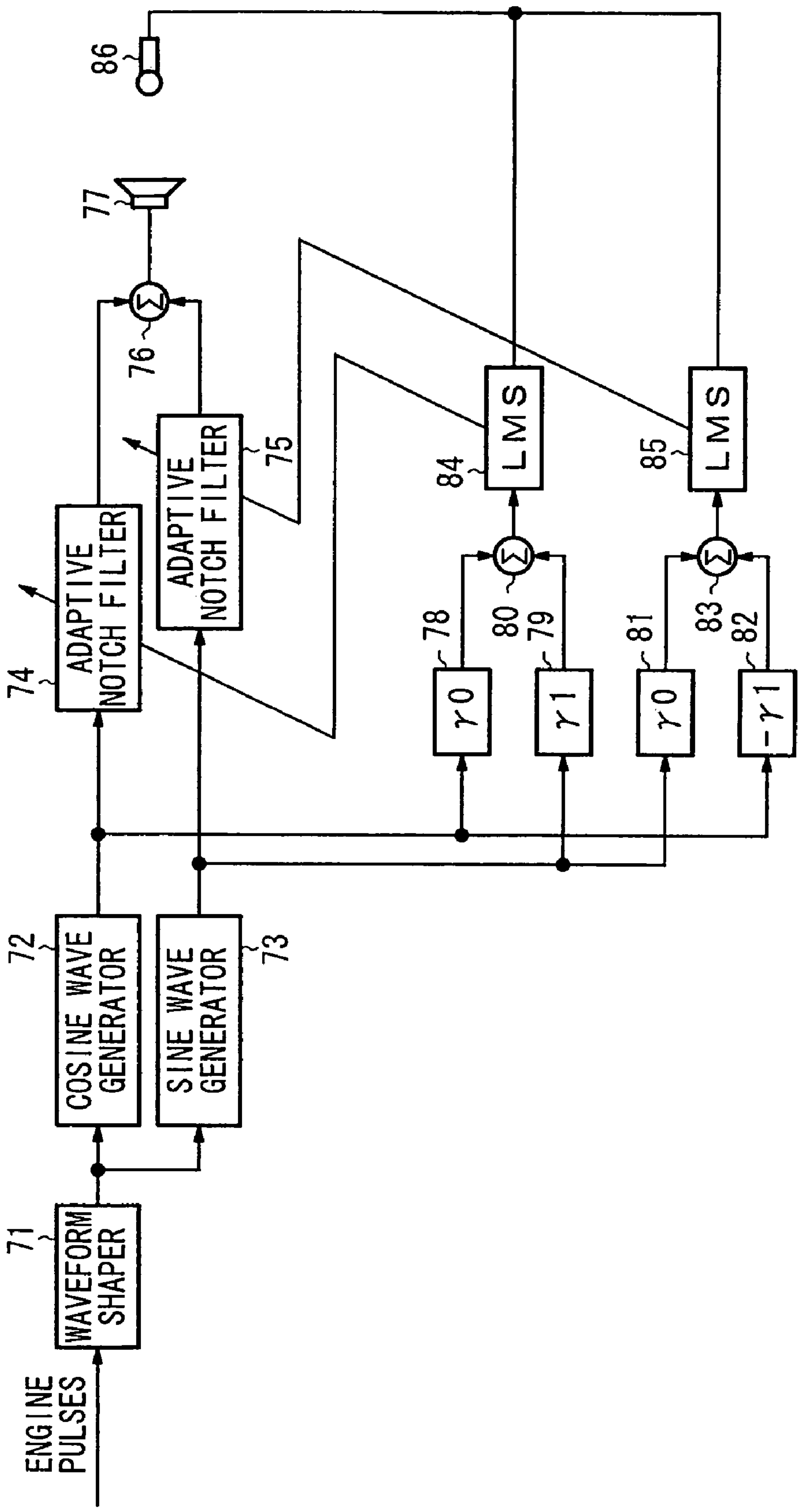
FIG. 14 PRIOR ART
FIG. 14 is a block diagram of a conventional active vibratory noise control apparatus employing adaptive notch filters.

FIG. 13 schematically shows an arrangement for canceling muffled sounds in the passenger compartment of the vehicle 61 with the active vibratory noise control apparatus 10 which has two microphones.

In FIG. 13, the active vibratory noise control apparatus 10 comprises an 8-bit microcomputer, for example, and is represented by a reference signal generating means 64 and adaptive notch filters 65-1, 65-2.

A speaker 17-2 is disposed in a given position in a tray behind the rear seats in the vehicle 61, and another speaker 17-1 is disposed in a given position on a lower portion of a door near a front seat. A microphone 18-2 is disposed on a ceiling portion of the passenger compartment which faces the back of the rear seat of the vehicle 61, and another microphone 18-1 is disposed on a central portion facing the front seat of the vehicle 61.

Engine pulses output from an engine controller 63 which controls an engine 62 of the vehicle 61 are input to the active vibratory noise control apparatus 10 which coacts with the speakers 17-1, 17-2 and the microphones 18-1, 18-2. The adaptive notch filters 65-1, 65-2 which are adaptively controlled to minimize output signals from the microphone 18-1, 18-2 apply output signals to energize the speakers 17-1, 17-2 to cancel vibratory noise in the passenger compartment of the vehicle 61. The process of canceling vibratory noise has already been described above with respect to the active vibratory noise control apparatus 10.

First and second reference signals for updating the filter coefficients of the adaptive notch filter 65-1 are generated based on cosine and sine corrective values based on the phase lag of the signal transfer characteristics between the speaker 17-1 and the microphone 18-1 and the phase lag of the signal transfer characteristics between the speaker 17-1 and the microphone 18-2. The speaker 17-1 is energized by an output signal from the adaptive notch filter 65-1 which is adaptively controlled to minimize error signals from the microphones 18-1, 18-2 in response to the error signals from the microphones 18-1, 18-2 and the reference signals. First and second reference signals for updating the filter coefficients of the adaptive notch filter 65-2 are generated based on cosine and sine corrective values based on the phase lag of the signal transfer characteristics between the speaker 17-2 and the microphone 18-1 and the phase lag of the signal transfer characteristics between the speaker 17-2 and the microphone 18-2. The speaker 17-2 is energized by an output signal from the adaptive notch filter 65-2 which is adaptively controlled to minimize error signals from the microphones 18-1, 18-2 in response to the error signals from the microphones 18-1, 18-2 and the reference signals. In this manner, muffled sounds in the passenger compartment are canceled.

The active vibratory noise control apparatus according to the present invention can optimally model the signal transfer characteristics from the vibratory noise canceling means to the error signal detecting means without using FIR filters, but with a first reference signal produced by subtracting the product of a sine corrective value based on the sine value of the phase characteristics of the signal transfer characteristics and a reference sine wave signal from the product of a cosine corrective value based on the cosine value of the phase characteristics of the signal transfer characteristics and a reference cosine wave signal, and a second reference signal produced by adding the product of the sine corrective value and the reference cosine wave signal and the product of the cosine corrective value and the reference sine wave signal to each other. The active vibratory noise control apparatus can cancel generated vibratory noise through a reduced number of calculations with a sufficient converging capability.

Although certain preferred embodiments of the present invention have been shown and described in detail, it should be understood that various changes and modifications may be made therein without departing from the scope of the appended claims.

What is claimed is:

1. An apparatus for actively controlling vibratory noise, comprising:

reference signal generating means for outputting, as reference signals, a reference sine wave signal and a reference cosine wave signal having a frequency based on the frequency of vibration from a vibratory noise source;

a first adaptive notch filter for outputting a first control signal based on said reference cosine wave signal and a second adaptive notch filter for outputting a second control signal based on said reference sine wave signal in order to cancel generated vibratory noise which is generated based on the vibration from said vibratory noise source;

vibratory noise canceling means for inputting a sum signal representing the sum of said first control signal and said second control signal, and outputting canceling vibratory noise to cancel the generated vibratory noise;

error signal detecting means for outputting an error signal based on the difference between said generated vibratory noise and the canceling vibratory noise output from said vibratory noise canceling means;

correcting means for correcting said reference cosine wave signal and said reference sine wave signal based on corrective values corresponding to signal transfer characteristics from said vibratory noise canceling means to said error signal detecting means with respect to the frequencies of said reference signals, and outputting the corrected reference cosine wave signal and the corrected reference sine wave signal respectively as first and second reference signals; and filter coefficient updating means for sequentially updating filter coefficients of said first adaptive notch filter and said second adaptive notch filter to minimize said error signal based on said error signal and said first and second reference signals;

wherein said correcting means outputs, as said first reference signal, a signal produced by subtracting the product of a sine corrective value based on the sine value of the phase characteristics of the signal transfer characteristics and said reference sine wave signal from the product of a cosine corrective value based on the cosine value of the phase characteristics of the signal transfer characteristics and said reference cosine wave signal, and outputs, as said second reference signal, a signal produced by adding the product of said sine corrective value and said reference cosine wave signal and the product of said cosine corrective value and said reference sine wave signal to each other; and wherein said filter coefficient updating means successively updates the filter coefficients of said first adaptive notch filter based on said first reference signal and said error signal and successively updates the filter coefficients of said second adaptive notch filter based on said second reference signal and said error signal.

2. An apparatus according to claim 1, wherein said cosine corrective value and said sine corrective value are stored in advance in a storage device in association with the frequencies of said reference signals, and are read therefrom in association with the frequencies of said reference signals.

3. An apparatus according to claim 2, wherein a measurement gain of a predetermined frequency in the signal transfer characteristics is corrected at a predetermined value, and said cosine corrective value and said sine corrective value which are stored in said storage device with respect to reference signals having the same frequency comprise values determined based on the corrected gain and measured phase characteristics.

4. A vehicle incorporating an apparatus for actively controlling vibratory noise according to claim 1.

5. A method of actively controlling vibratory noise, comprising the steps of:

outputting, as reference signals, a reference sine wave signal and a reference cosine wave signal having a frequency based on the frequency of vibration from a vibratory noise source;

outputting a first control signal with a first adaptive notch filter based on said reference cosine wave signal and outputting a second control signal with a second adaptive notch filter based on said reference sine wave signal in order to cancel generated vibratory noise which is generated based on the vibration from said vibratory noise source;

inputting a sum signal representing the sum of said first control signal and said second control signal to a vibratory noise canceling means, and outputting canceling vibratory noise to cancel the generated vibratory noise from said vibratory noise canceling means;

outputting an error signal from an error signal detecting means based on the difference between said generated vibratory noise and the canceling vibratory noise output from said vibratory noise canceling means;

correcting said reference cosine wave signal and said reference sine wave signal based on corrective values corresponding to signal transfer characteristics from said vibratory noise canceling means to said error signal detecting means with respect to the frequencies of said reference signals, and outputting the corrected reference cosine wave signal and the corrected reference sine wave signal respectively as first and second reference signals; and sequentially updating filter coefficients of said first adaptive notch filter and said second adaptive notch filter to minimize said error signal based on said error signal and said first and second reference signals;

wherein said correcting step outputs, as said first reference signal, a signal produced by subtracting the product of a sine corrective value based on the sine value of the phase characteristics of the signal transfer characteristics and said reference sine wave signal from the product of a cosine corrective value based on the cosine value of the phase characteristics of the signal transfer characteristics and said reference cosine wave signal, and outputs, as said second reference signal, a signal produced by adding the product of said sine corrective value and said reference cosine wave signal and the product of said cosine corrective value and said reference sine wave signal to each other; and wherein said updating step successively updates the filter coefficients of said first adaptive notch filter based on said first reference signal and said error signal and successively updates the filter coefficients of said second adaptive notch filter based on said second reference signal and said error signal.

6. A method according to claim 5, wherein said cosine corrective value and said sine corrective value are stored in advance in a storage device in association with the frequencies of said reference signals, and are read therefrom in association with the frequencies of said reference signals.

7. A method according to claim 6, wherein a measurement gain of a predetermined frequency in the signal transfer characteristics is corrected at a predetermined value, and said cosine corrective value and said sine corrective value which are stored in said storage device with respect to reference signals having the same frequency comprise values determined based on the corrected gain and measured phase characteristics.

* * * * *